(12) United States Patent
Sutton et al.

(10) Patent No.: US 8,654,215 B2
(45) Date of Patent: *Feb. 18, 2014

(54) MOBILE COMMUNICATOR WITH CURVED SENSOR CAMERA

(76) Inventors: Gary Edwin Sutton, La Jolla, CA (US);
Douglas Gene Lockie, Los Gatos, CA (US)

(*) Notice: Subject to any disclaimer, the term of this patent is extended or adjusted under 35 U.S.C. 154(b) by 538 days.

This patent is subject to a terminal disclaimer.

(21) Appl. No.: 12/930,165

(22) Filed: Dec. 28, 2010

(65) Prior Publication Data

US 2012/0162483 A1    Jun. 28, 2012

Related U.S. Application Data

(63) Continuation-in-part of application No. PCT/GB2010/000298, filed on Feb. 19, 2010, and a continuation-in-part of application No. 12/655,819, filed on Jan. 6, 2010, now Pat. No. 8,248,499.

(60) Provisional application No. 61/208,456, filed on Feb. 23, 2009.

(51) Int. Cl.
*H04N 5/262* (2006.01)

(52) U.S. Cl.
USPC ................................ 348/240.2

(58) Field of Classification Search
USPC ................................ 348/240.2
See application file for complete search history.

(56) References Cited

U.S. PATENT DOCUMENTS 6,455,831 B1  9/2002  Bandera
6,489,992 B2  12/2002  Savoye
7,110,033 B2  9/2006  Miyake
7,162,806 B1  1/2007  Swiggart (Continued)

FOREIGN PATENT DOCUMENTS

CA  2 570 955  6/2008
DE  31 06 636  3/1982

(Continued)

OTHER PUBLICATIONS

Rim, The Optical Advantages of Curved Focal Plane Arrays, Optics Express, Mar. 31, 2008, pp. 4965-4971, vol. 16, No. 7, USA.

(Continued)

*Primary Examiner* — James Hannett
(74) *Attorney, Agent, or Firm* — Thomas Nello Giaccherini

(57) ABSTRACT

Methods and apparatus for combining a mobile communication device having a camera (150) that includes a curved sensor (160) are disclosed. The present invention offers higher quality pictures that conventional phones that incorporate a flat sensor. These higher quality pictures are obtained without the need for large, bulky and expensive lenses. Higher light gathering capacity is provided, which reduces or eliminates the need for a flash to enhance ambient illumination. Longer battery life is obtained, since the need for a flash is reduced or eliminated. The combination of a mobile communication device with a camera that utilizes a curved sensor renders dedicated pocket cameras obsolete. The present invention, which, for the first time, combines a mobile communication device with a high performance camera, will reduce or eliminate the need to carry a separate stand-alone camera.

8 Claims, 47 Drawing Sheets

(56) References Cited

U.S. PATENT DOCUMENTS

| | | |
|---|---|---|
| 7,196,391 B2 | 3/2007 | Hsieh |
| 7,277,242 B1 | 10/2007 | Wang |
| 7,294,828 B2 | 11/2007 | Kinoshita |
| 8,248,499 B2 * | 8/2012 | Sutton et al. ............ 348/294 |
| 2001/0020671 A1 | 9/2001 | Ansorge |
| 2002/0154239 A1 | 10/2002 | Fujimoto |
| 2003/0179303 A1 | 9/2003 | Bittner |
| 2004/0095492 A1 | 5/2004 | Baxter |
| 2005/0030408 A1 | 2/2005 | Ito |
| 2005/0268521 A1 | 12/2005 | Cox |
| 2006/0109367 A1 | 5/2006 | Hirooka |
| 2006/0291844 A1 | 12/2006 | Kakkori |
| 2007/0133977 A1 | 6/2007 | Mayumi |
| 2007/0166027 A1 | 7/2007 | Misawa |
| 2007/0188650 A1 | 8/2007 | Kobayashi |
| 2008/0151089 A1 | 6/2008 | Street |
| 2008/0259194 A1 | 10/2008 | Silverstein |
| 2009/0115875 A1 * | 5/2009 | Choi et al. ............... 348/294 |

FOREIGN PATENT DOCUMENTS

| | | |
|---|---|---|
| EP | 786 815 | 7/1997 |
| EP | 0 973 122 | 1/2000 |
| EP | 1 333 498 | 8/2003 |
| FR | 2 830 128 | 9/2001 |
| WO | WO 2006 116268 | 11/2006 |
| WO | WO 2007 058728 | 5/2007 |
| WO | WO 2008 041739 | 10/2008 |
| WO | WO 2009 022178 | 2/2009 |
| WO | WO 2009 211224 | 2/2009 |

OTHER PUBLICATIONS

Park, Super-Resolution Image Reconstruction, IEEE Signal Processing Magazine, May 2005, pp. 21-36, vol. 20, No. 3, USA.

Scheffer, Log Polar Image Sensor in CMOS Technolgy, SPIE, Jun. 10, 1996, pp. 2-11, vol. 2784, USA.

* cited by examiner

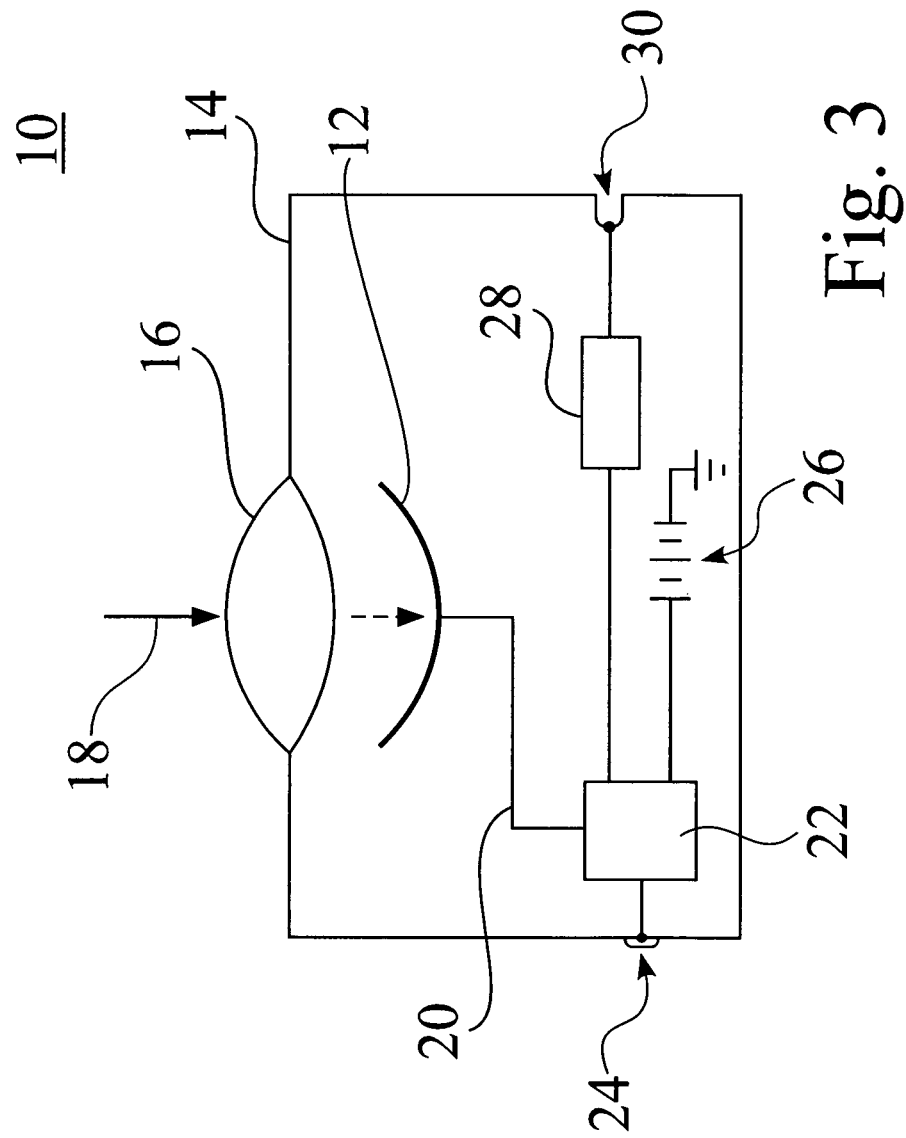

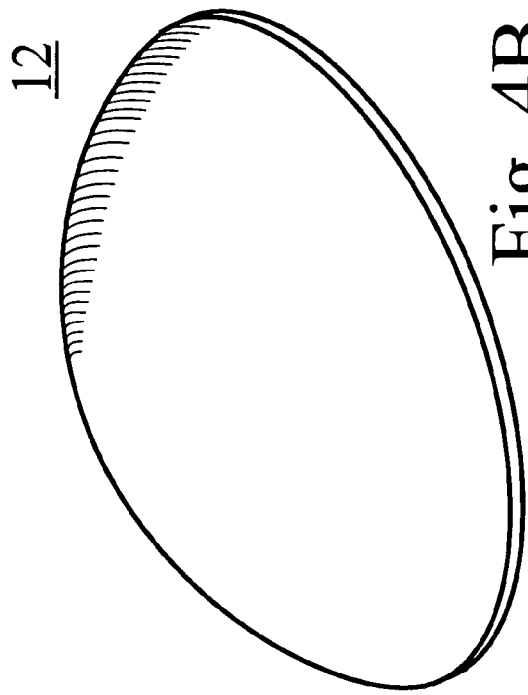
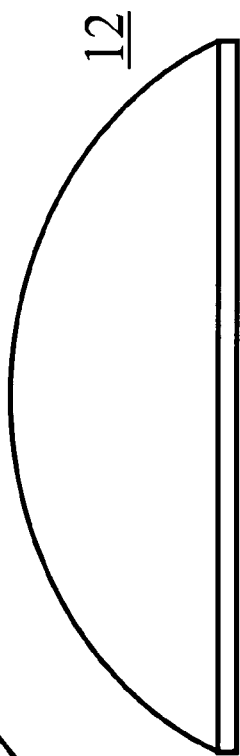
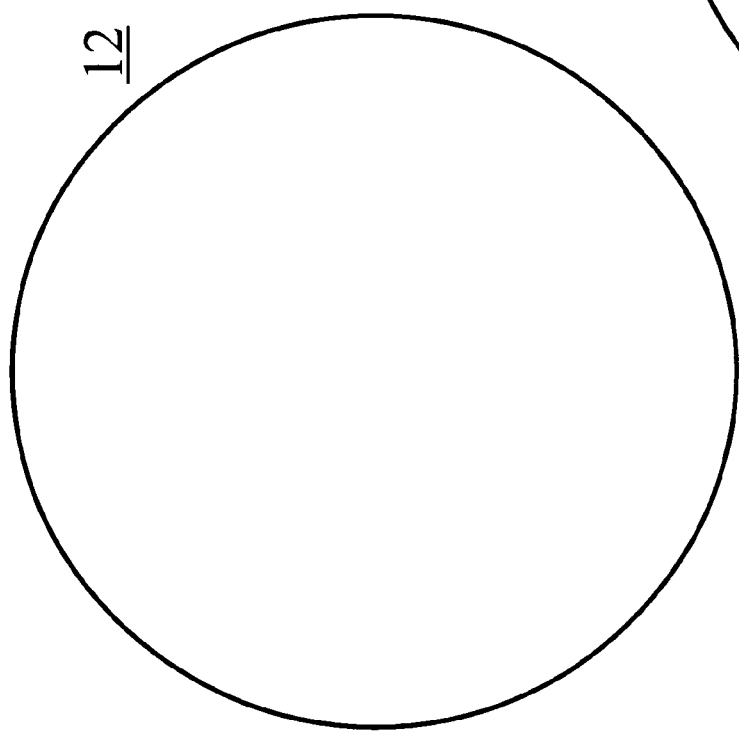
Fig. 4A
Fig. 4B
Fig. 4C

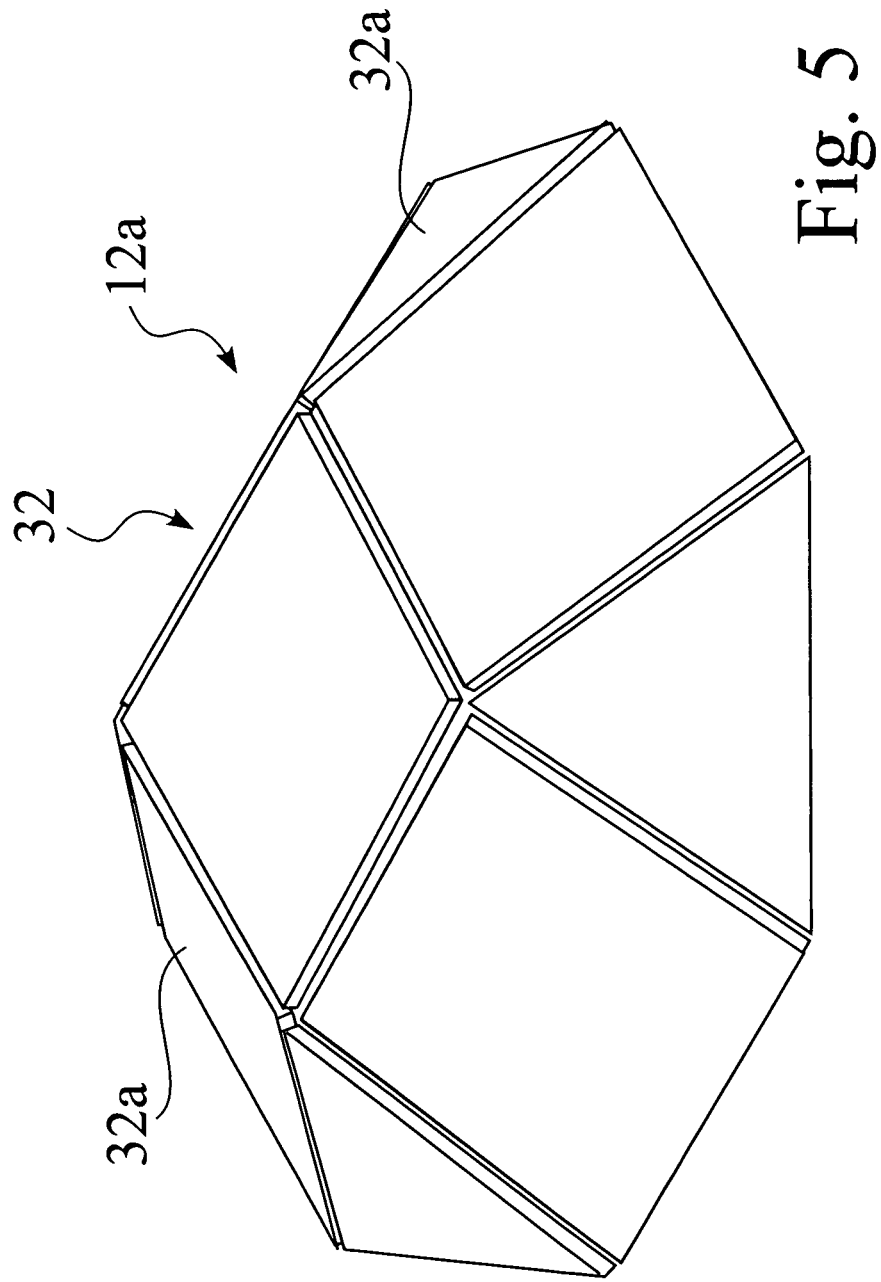

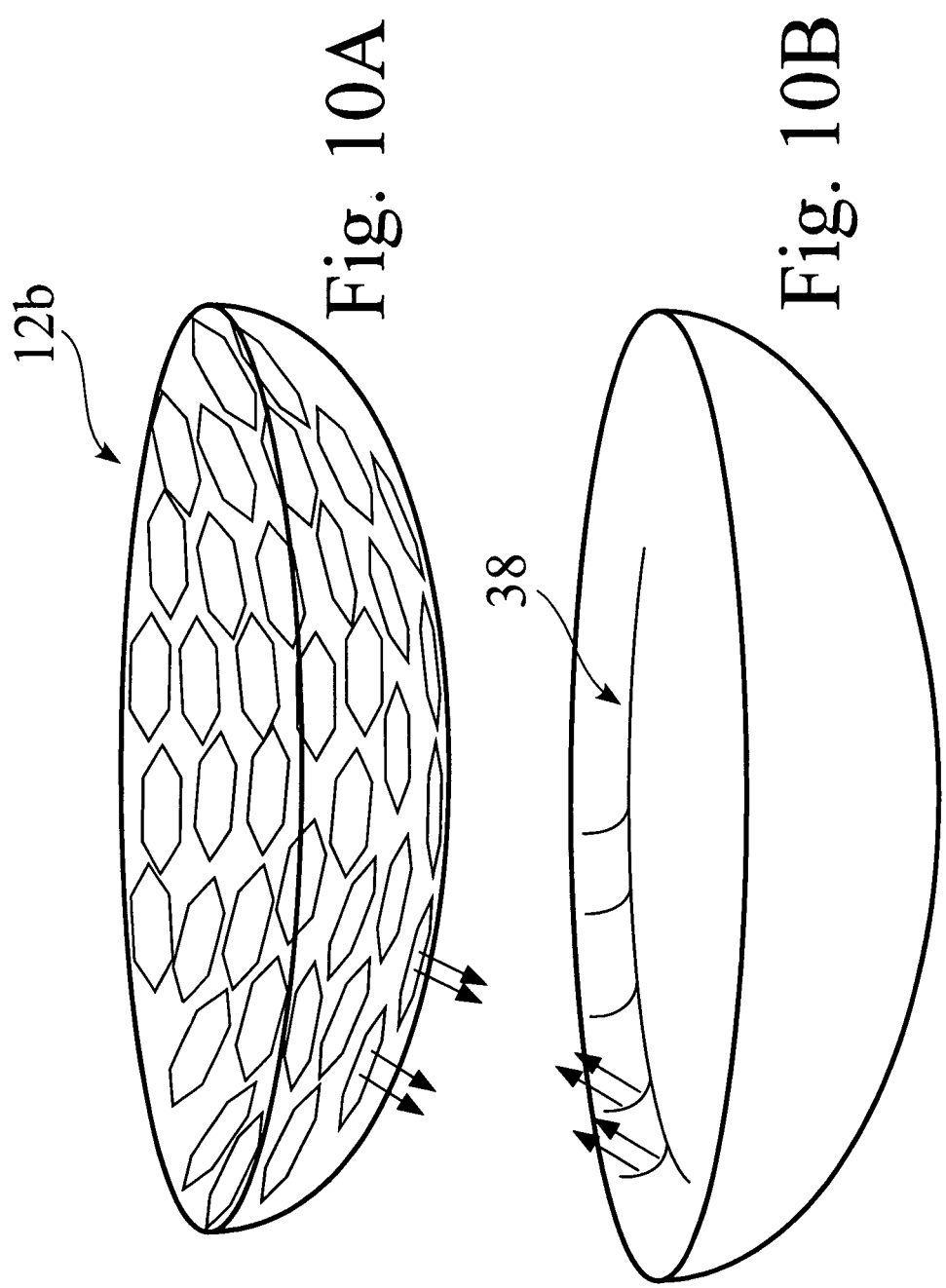

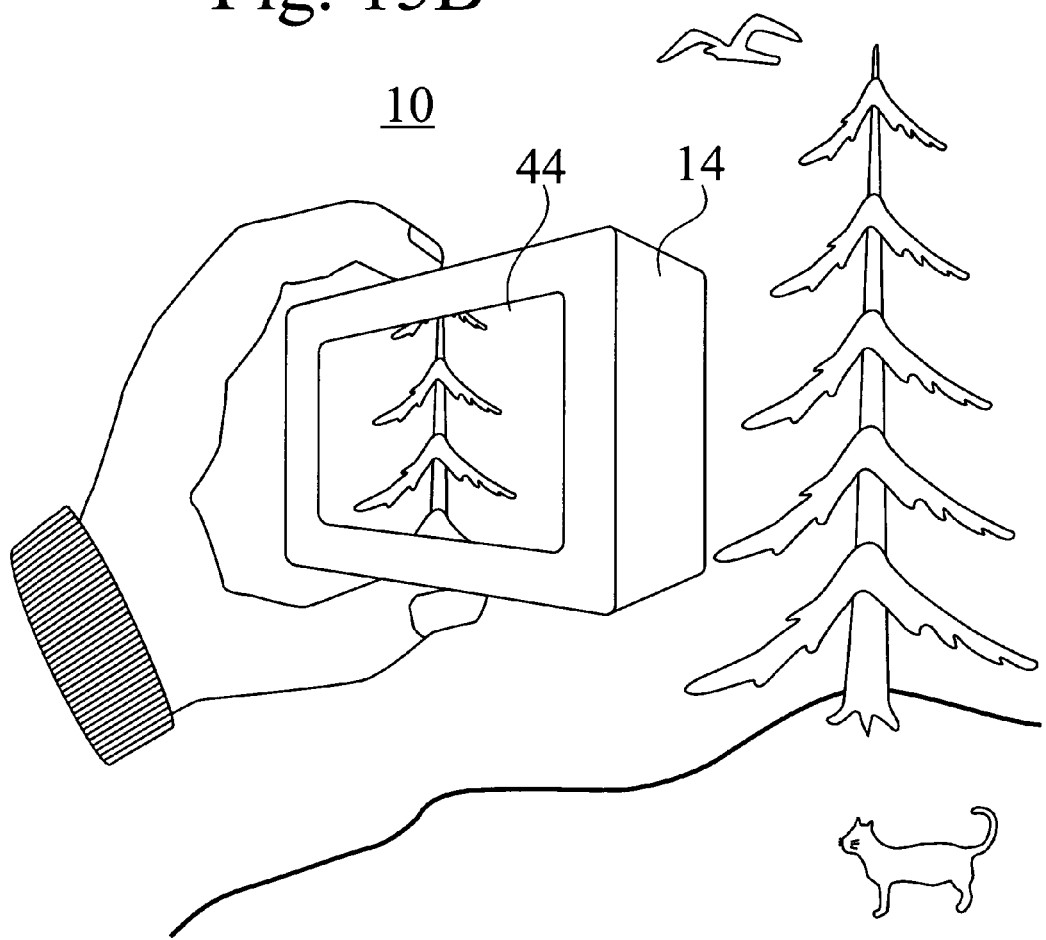

original photo original translated

2 shot, 1/2 pixel to the right →

2, translated

3 shot, 1/2 pixel up ↑

3, translated

4 shot, 1/2 pixel left ←

4, translated

MOBILE COMMUNICATOR WITH CURVED SENSOR CAMERA

CROSS-REFERENCE TO RELATED PENDING PATENT APPLICATIONS, CLAIMS FOR PRIORITY & INCORPORATION BY REFERENCE

The Present Continuation-in-Part patent application is related to:

Pending U.S. Non-Provisional application Ser. No. 12/655,819, filed on 6 Jan. 2010;

Provisional Patent Application 61/208,456, filed on 23 Feb. 2009; and

Pending PCT International Patent Application No. PCT/GB2010/000298, filed on 19 Feb. 2010.

In accordance with the provisions of Sections 119 and/or 120 of Title 35 of the United States Code of Laws, the Applicants claim the benefit of priority for any and all subject matter which is commonly disclosed in the Present Continuation-in-Part patent application, and in any of the related patent applications identified above.

The subject matter of the Non-Provisional Application and the PCT International Patent Applications identified above are hereby incorporated by reference.

FIELD OF THE INVENTION

One embodiment of the present invention relates to the combination of a communication device with a camera that includes a curved sensor. This combination offers higher quality photographs than those that may be obtained with conventional cell phone cameras, and eliminates the need to carry a separate stand-alone pocket camera.

INTRODUCTION

The title of this Continuation-in-Part patent application is Mobile Communicator with Curved Sensor Camera. The Applicants are:

Gary Edwin Sutton of 1865 Caminito Ascua, La Jolla, Calif. 92037; and

Douglas Gene Lockie of 19267 Mountain Way, Los Gatos, Calif. 95030.

Both Inventors are Citizens of the United States of America.

FEDERALLY SPONSORED RESEARCH OR DEVELOPMENT

None.

BACKGROUND OF THE INVENTION

I. A Brief History of Cameras

Evolution of the Three Primary Camera Types

Current photographic cameras evolved from the first "box" and "bellows" models into three basic formats by the late twentieth century.

The rangefinder came first. It was followed by the SLR, or, single lens reflex and finally the Compact "Point and Shoot" cameras. Most portable cameras today use rangefinder, SLR or "Point and Shoot" formats.

Simple Conventional Cameras

FIG. 1 is a simplified view of a conventional camera, which includes an enclosure, an objective lens and a flat section of photographic film or a flat sensor.

A simple lens with a flat film or sensor faces several problems. Light travels over a longer pathway to the edges of the film or the sensor's image area, diluting those rays. Besides being weaker, as those rays travel farther to the sensor's edges, they suffer more "rainbow effect," or chromatic aberration.

FIG. 2 presents a simplified view of the human eye, which includes a curved surface for forming an image. The human eye, for example, needs only a cornea and a single lens to form an image. But on average, one human retina contains twenty-five million rods and six million cones. Today's high end cameras use lenses with from six to twenty elements. Only the rarest, most expensive cameras have as many pixels as the eye has rods and cones, and none of these cameras capture images after sunset without artificial light.

The eagle's retina has eight times as many retinal sensors as the human eye. They are arranged on a sphere the size of a marble. The eagle's rounded sensors make simpler optics possible. No commercially available camera that is available today has a pixel count which equals a fourth of the count of sensors in an eagle's eye. The eagle eye uses a simple lens and a curved retina. The best conventional cameras use multiple element lenses with sophisticated coatings, exotic materials and complex formulas. This is all to compensate for their flat sensors. The eagle sees clearly at noon, in daylight or at dusk with simpler, lighter and smaller optics than any camera.

Rangefinder Cameras

Rangefinder cameras are typified by a broad spectrum from the early LEICA™ thirty-five millimeter cameras, for professionals, to the later "INSTAMATIC™" film types for the masses. (Most of KODAK's™ INSTAMATIC™ cameras did not focus, so they were not true rangefinders. A few "Instamatic type" models focused, and had a "viewing" lens separated from the "taking" lens, qualifying them as rangefinders.)

Rangefinder cameras have a "taking" lens to put the image on the film (or sensor today) when the shutter opens and closes; mechanically or digitally. These cameras use a second lens for viewing the scene. Focusing takes place through this viewing lens which connects to, and focuses, the taking lens.

Since the taking lens and the viewing lens are different, and have different perspectives on the scene being photographed, the taken image is always slightly different than the viewed image. This problem, called parallax, is minor in most situations but becomes acute at close distances.

Longer telephoto lenses, which magnify more, are impractical for rangefinder formats. This is because two lenses are required, they are expensive and require more side-to-side space than exists within the camera body. That's why no long telephoto lenses exist for rangefinder cameras.

Some rangefinder cameras use a frame in the viewfinder which shifts the border to match that of the taking lens as the focus changes. This aligns the view with the picture actually taken, but only for that portion that's in focus. Backgrounds and foregrounds that are not in focus shift, so those parts of the photographed image still vary slightly from what was seen in the viewfinder.

A few rangefinder cameras do exist that use interchangeable or attachable lenses, but parallax remains an unsolvable problem and so no manufacturer has ever introduced a rangefinder camera with much beyond slightly wide or mildly long telephoto accessories. Any added rangefinder lens must also be accompanied by a similar viewfinder lens. If not, what is viewed won't match the photograph taken at all. This doubles the lens cost.

A derivation of the rangefinder, with the same limitations for accessory lenses, was the twin lens reflex, such as those made by ROLLEI-WERKE™ cameras. Compact, or "Point and Shoot" Cameras Currently, the most popular format for casual photographers is the "Point and Shoot" camera. They emerged first as film cameras but are now nearly all digital. Many have optical zoom lenses permanently attached with no possibility for interchanging optics. The optical zoom, typically, has a four to one range, going from slight wide angle to mild telephoto perspectives. Optical zooms don't often go much beyond this range for acceptable results and speed. Some makers push optical zoom beyond this four to one range, but the resulting images and speeds deteriorate. Others add digital zoom to enhance their optical range; causing results that most trade editors and photographers currently hate, for reasons described in following paragraphs.

There are no "Point and Shoot" cameras with wide angle lenses as wide as the perspective are for an eighteen millimeter SLR lens (when used, for relative comparison, on the old standard thirty-five millimeter film SLR cameras.) There are no "Point and Shoot" cameras with telephoto lenses as long as a two hundred millimeter SLR lens would have been (if on the same old thirty-five millimeter film camera format.)

Today, more photographs are taken daily by mobile phones and PDAs than by conventional cameras. These will be included in the references herein as "Point and Shoot Cameras."

Single Lens Reflex (SLR) Cameras

Single lens reflex cameras are most commonly used by serious amateurs and professionals today since they can use wide selections of accessory lenses.

With 35 mm film SLRs, these lenses range from 18 mm "fisheye" lenses to 1,000 mm super-telephoto lenses, plus optical zooms that cover many ranges in between.

With SLRs there's a mirror behind the taking lens which reflects the image into a viewfinder. When the shutter is pressed, this mirror flips up and out of the way, so the image then goes directly onto the film or sensor. In this way, the viewfinder shows the photographer almost the exact image that will be taken, from extremes in wide vistas to distant telephoto shots. The only exception to an "exact" image capture comes in fast action photography, when the delay caused by the mirror movement can result in the picture taken being slightly different than that image the photographer saw a fraction of a second earlier.

This ability to work with a large variety of lenses made the SLR a popular camera format of the late twentieth century, despite some inherent disadvantages.

Those SLR disadvantages are the complexity of the mechanism, requiring more moving parts than with other formats, plus the noise, vibration and delay caused by the mirror motion. Also, lens designs are constrained, due to the lens needing to be placed farther out in front of the path of the moving mirror, which is more distant from the film or sensor, causing lenses to be heavier, larger and less optimal. There is also the introduction of dust, humidity and other foreign objects into the camera body and on the rear lens elements when lenses are changed.

Dust became a worse problem when digital SLRs arrived, since the sensor is fixed, unlike film. Film could roll away the dust speck so only one frame was affected. With digital cameras, every picture is spotted until the sensor is cleaned. Recent designs use intermittent vibrations to clear the sensor. This doesn't remove the dust from the camera and fails to remove oily particles. Even more recent designs, recognizing the seriousness of this problem, have adhesive strips inside the cameras to capture the dust if it is vibrated off from the sensor. These adhesive strips, however, should be changed regularly to be effective, and, camera users typically would require service technicians to do this.

Since the inherent function of an SLR is to use interchangeable lenses, the problem continues.

Extra weight and bulk are added by the mirror mechanism and viewfinder optics to SLRs. SLRs need precise lens and body mounting mechanisms, which also have mechanical and often electrical connections between the SLR lens and the SLR body. This further adds weight, complexity and cost.

Some of these "vibration" designs assume all photos use a horizontal format, with no adhesive to catch the dust if the sensor vibrates while in a vertical position, or, when pointed skyward or down.

Optical Zoom Lenses

Optical zoom lenses reduce the need to change lenses with an SLR. The photographer simply zooms in or out for most shots. Still, for some situations, an even wider or longer accessory lens is required with the SLR, and the photographer changes lenses anyway.

Many "Point and Shoot" cameras today have zoom lenses as standard; permanently attached. Nearly all SLRs offer zoom lenses as accessories. While optical technology continues to improve, there are challenges to the zoom range any lens can adequately perform. Other dilemmas with zoom lenses are that they are heavier than their standard counterparts, they are "slower," meaning less light gets through, limiting usefulness, and zoom lenses never deliver images that are as sharp or deliver the color fidelity as a comparable fixed focal length lens. And again, the optical zoom, by moving more elements in the lens, introduces more moving parts, which can lead to mechanical problems with time and usage, plus added cost. Because optical zooms expand mechanically, they also function like an air pump, sucking in outside air while zooming to telephoto and squeezing out air when retracting for wider angle perspectives. This can introduce humidity and dust to the inner elements.

II. The Limitations of Conventional Mobile Phone Cameras

The Gartner Group has reported that over one billion mobile phones were sold worldwide in 2009. A large portion of currently available mobile phones include a camera. These cameras are usually low quality photographic devices with simple planar arrays situated behind a conventional lens. The quality of images that may be captured with these cell phone cameras is generally lower than that which may be captured with dedicated point-and-shoot or more advanced cameras. Cell phone cameras usually lack advanced controls for shutter speed, telephoto or other features.

Conventional cell phone and PDA cameras suffer from the same four deficiencies.
1. Because they use flat digital sensors, the optics are deficient, producing poor quality pictures. To get normal resolution would require larger and bulkier lenses, which would cause these compact devices to become unwieldy.
2. Another compromise is that these lenses are slow, gathering less light. Many of the pictures taken with these devices are after sunset or indoors. This often means flash is required to enhance the illumination. With the lens so close to the flash unit, as is required in a compact device, a phenomena known as "red-eye" often occurs. (In darkened situations, the human and animal pupil is dilated in order to see better. In that situation, the flash often reflects of the subject's retina, creating a disturbing image. This is so common that some camera makers wired their devices so a series of flashes go off before the picture is taken with flash, in an attempt to close down the pupils. This sometimes works and always disturbs the candid pose. Pencils to mark out "red eye" are available at retail. There are "red eye" pencils for humans and "pet eye" pencils for animals. Some camera software developers have written algorithms that detect "red eye" results and artificially remove the "red eye," sometimes matching the subject true eye color, but more often not.

3. Flash photography shortens battery life.
4. Flash photography is artificial. Faces in the foreground can be bleached white while backgrounds go dark. Chin lines are pronounced, and it sometimes becomes possible to see into a human subject's nostrils, which is not always pleasing to viewers.

Current sales of high definition television sets demonstrate the growing public demand for sharper images. In the past, INSTAMATIC® cameras encouraged more picture-taking, but those users soon tired of the relatively poor image quality. Thirty-five millimeter cameras, which were previously owned by professionals and serious hobbyists, soon became a mass market product.

With unprecedented numbers of photos now being taken with mobile phones, and the image quality being second-rate, the cycle is sure to repeat.

The development of a system that reduces these problems would constitute a major technological advance, and would satisfy long-felt needs in the imaging business.

SUMMARY OF THE INVENTION

The present invention comprises methods and apparatus for a mobile communication device which includes a camera that uses a curved sensor. In particular embodiments of the invention, the mobile communication device may include a cellular or wireless telephone, a smart phone, a personal digital assistant, a laptop or netbook computer, or any other generally portable information appliance.

The combination of the mobile communication device and curved sensor provides:
1. Higher quality pictures than conventional phones that incorporate a flat sensor. These higher quality pictures are obtained without the need for large, bulky and expensive lenses.
2. Higher light gathering capacity, which reduces or eliminates the need for a flash to enhance ambient illumination.
3. Longer battery life, since the need for a flash is reduced or eliminated.

The combination of a mobile communication device with a camera that utilizes a curved sensor renders dedicated pocket cameras obsolete. In recent years, millions of people have decided to no longer wear a wrist watch, because an electronic clock is built into their mobile telephone. The present invention, which, for the first time, combines a mobile communication device with a high performance camera, will reduce or eliminate the need to carry a separate stand-alone camera.

An appreciation of the other aims and objectives of the present invention, and a more complete and comprehensive understanding of this invention, may be obtained by studying the following description of a preferred embodiment, and by referring to the accompanying drawings.

A BRIEF DESCRIPTION OF THE DRAWINGS

FIG. 3 provides a generalized schematic diagram of a digital camera with a curved sensor manufactured in accordance with one embodiment of the present invention.

FIGS. 4A, 4B, and 4C offer an assortment of views of a generally curved sensor.

FIG. 5 depicts a sensor formed from nine planar segments or facets.

Figure 1:
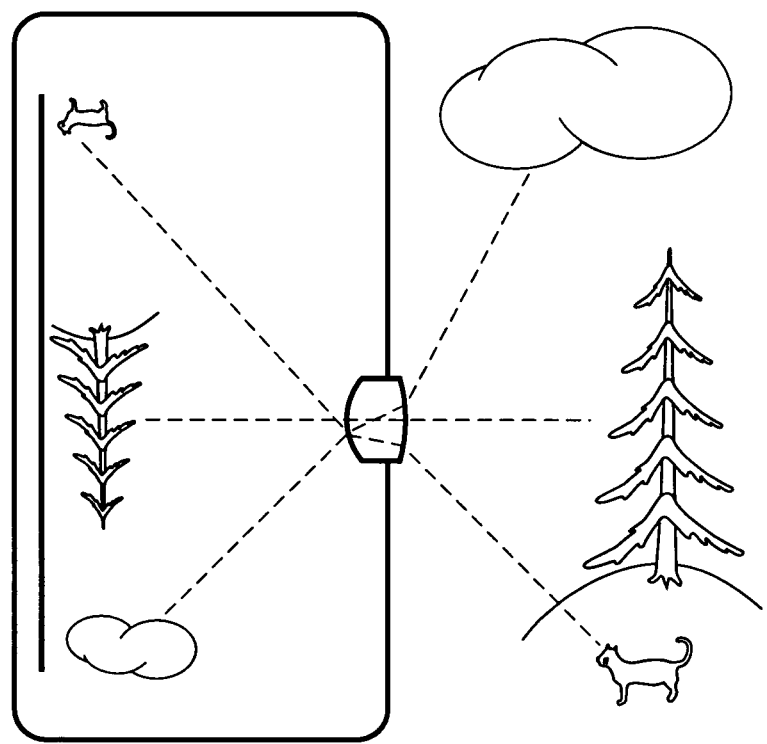
FIG. 1 depicts a generalized conventional camera with flat film or a flat sensor.
Figure 2:
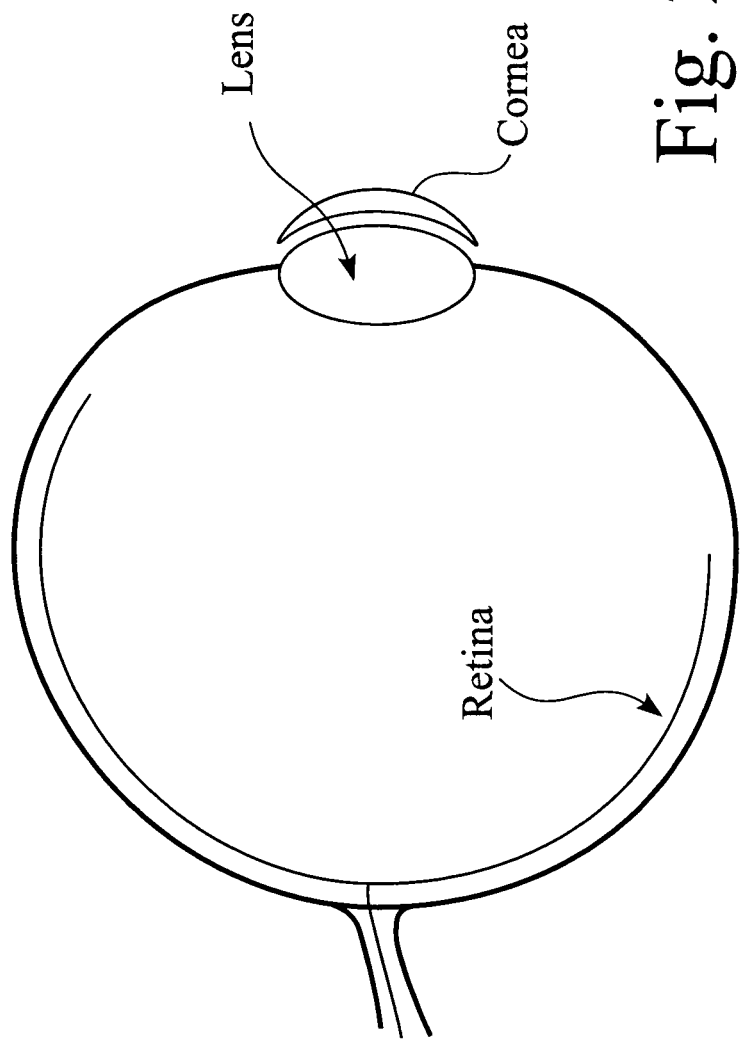
FIG. 2 is a simplified depiction of the human eye.
Figure 6:
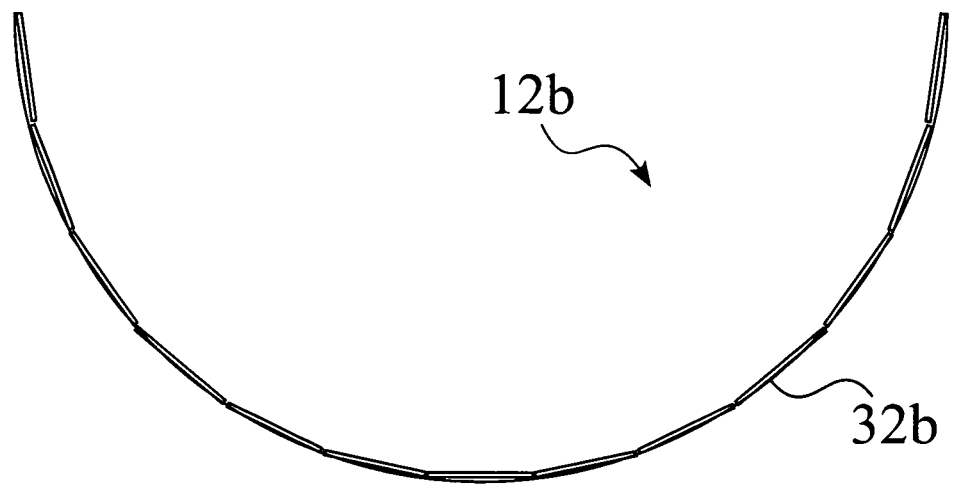

FIG. 6 reveals a cross-sectional view of a generally curved surface comprising a number of flat facets.

Figure 7:
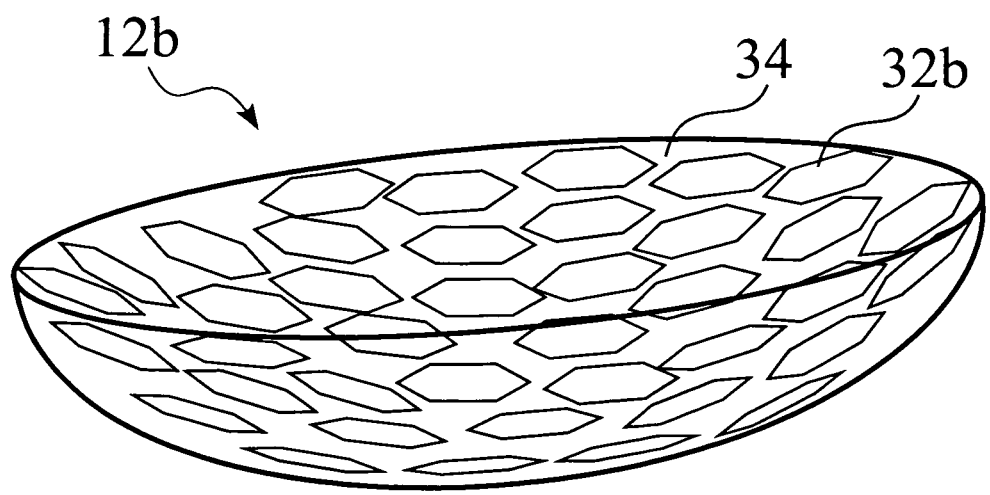

FIG. 7 provides a perspective view of the curved surface shown in FIG. 6.

Figure 8:
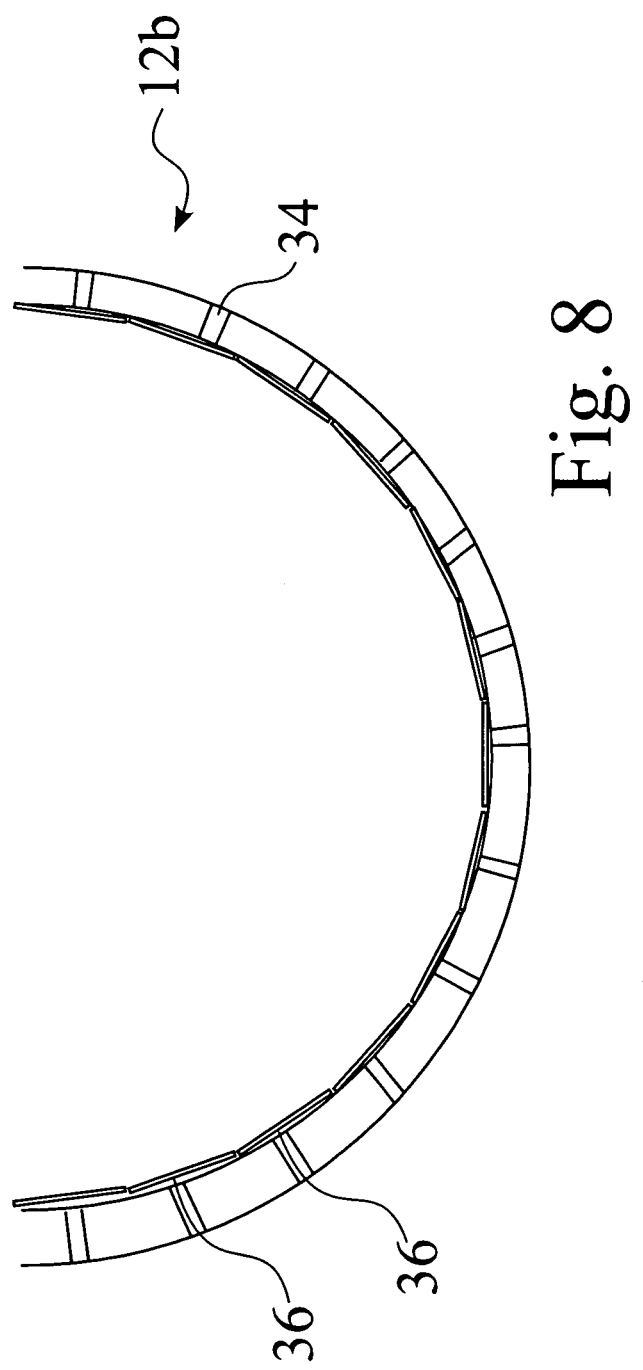

FIG. 8 offers a view of one method of making the electrical connections for the sensor shown in FIGS. 6 and 7.

Figure 9A:
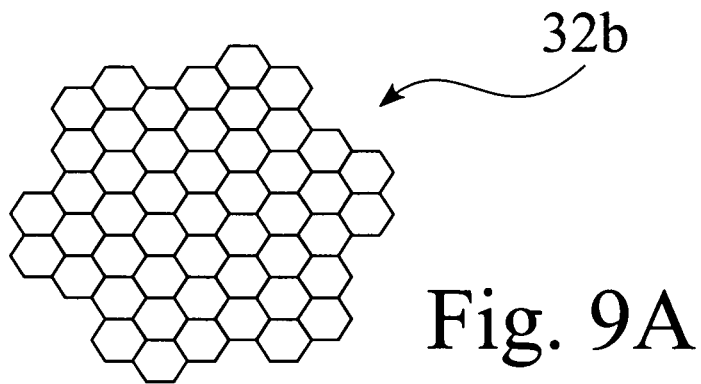
Figure 9B:
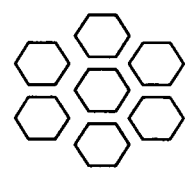

FIGS. 9A and 9B portray additional details of the sensor illustrated in FIG. 7, before and after enlarging the gaps above the substrate, so the flat surface can be bent.

FIGS. 10A and 10B supply views of sensor connections.

Figure 11A:
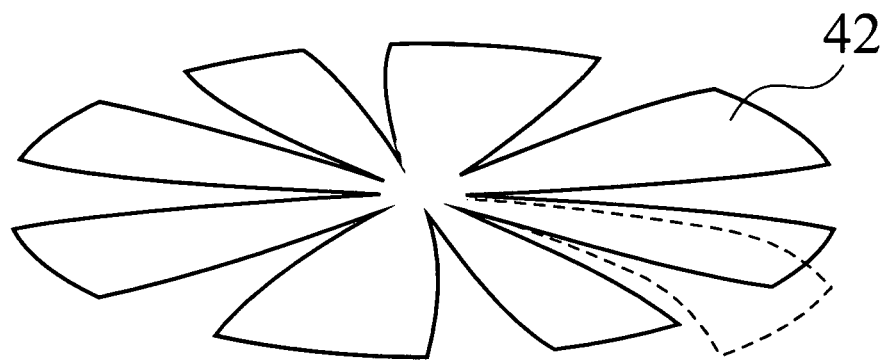
Figure 11B:
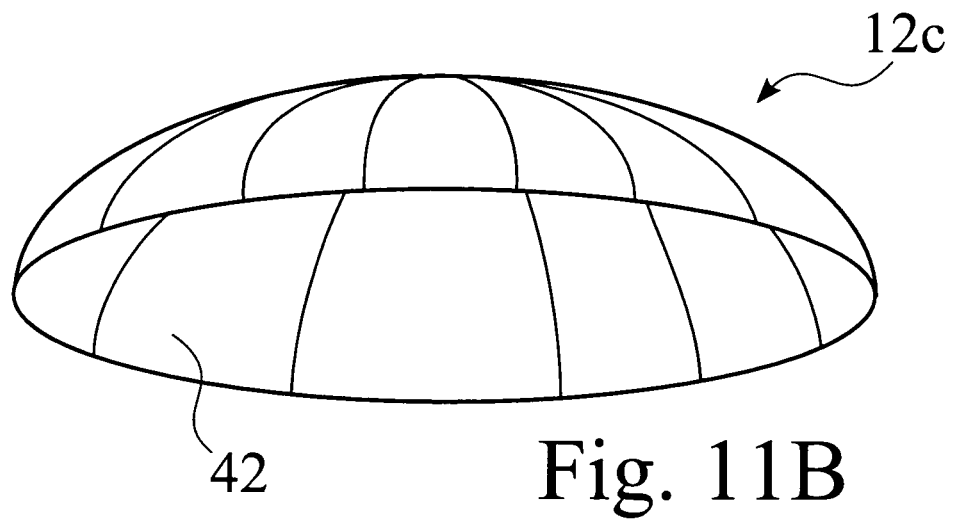

FIGS. 11A and 11B depict a series of petal-shaped segments of ultra-thin silicon that are bent or otherwise formed to create a generally dome-shaped surface.

Figure 12:
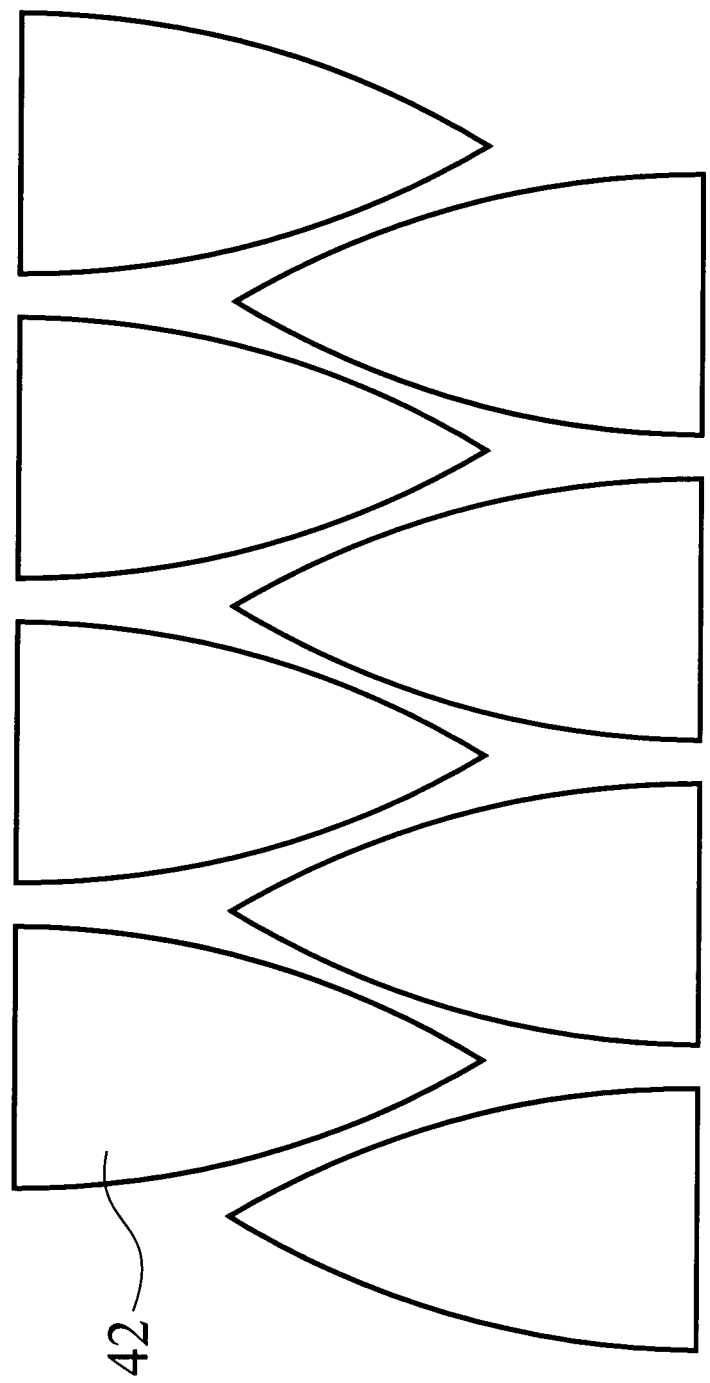

FIG. 12 furnishes a detailed view of an array of sensor segments.

Figure 13:
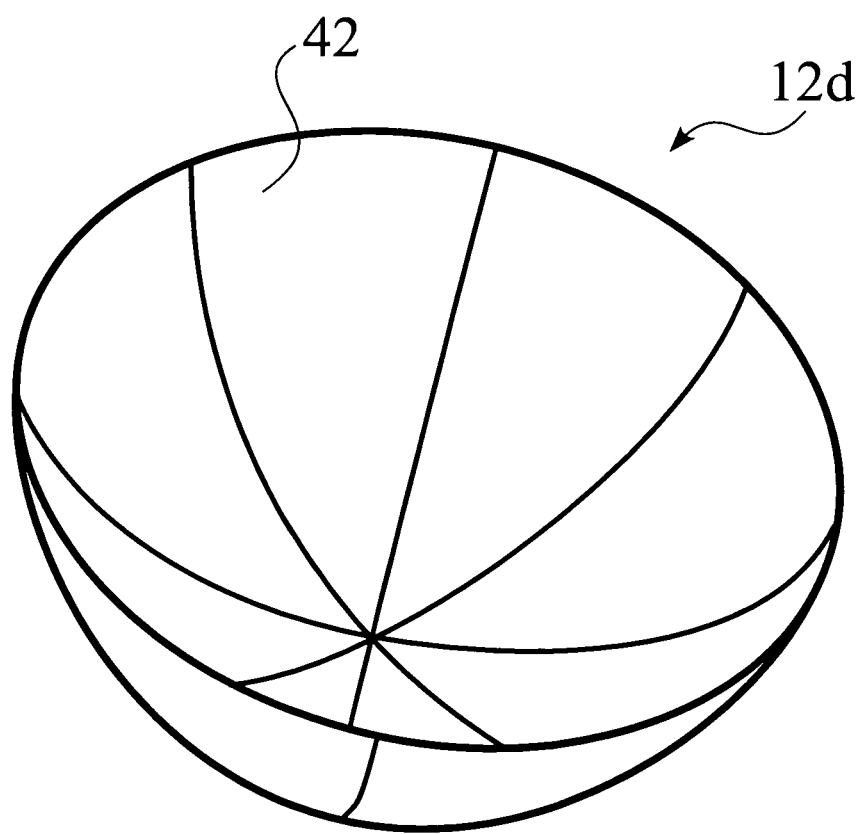

FIG. 13 is a perspective view of a curved shape that is produced when the segments shown in FIG. 12 are joined.

Figure 14A:
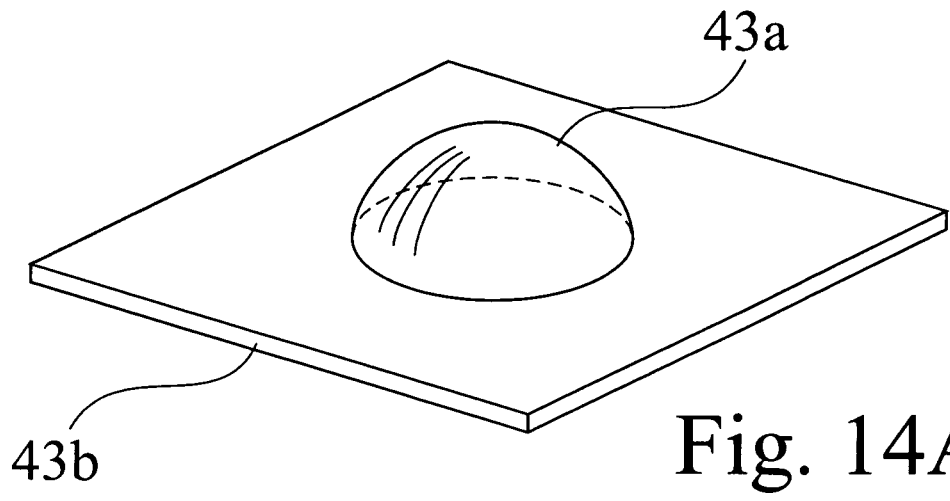
Figure 14B:
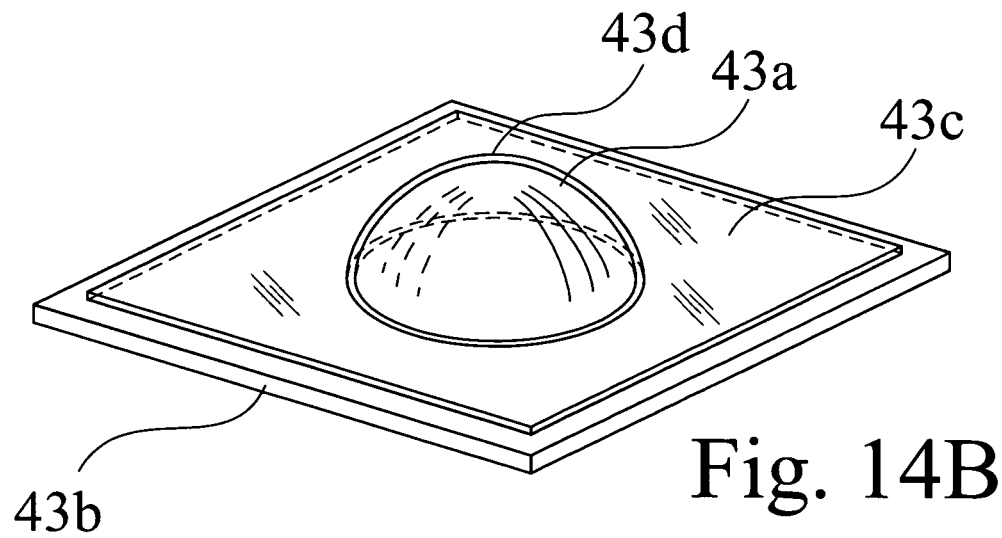
Figure 14C:
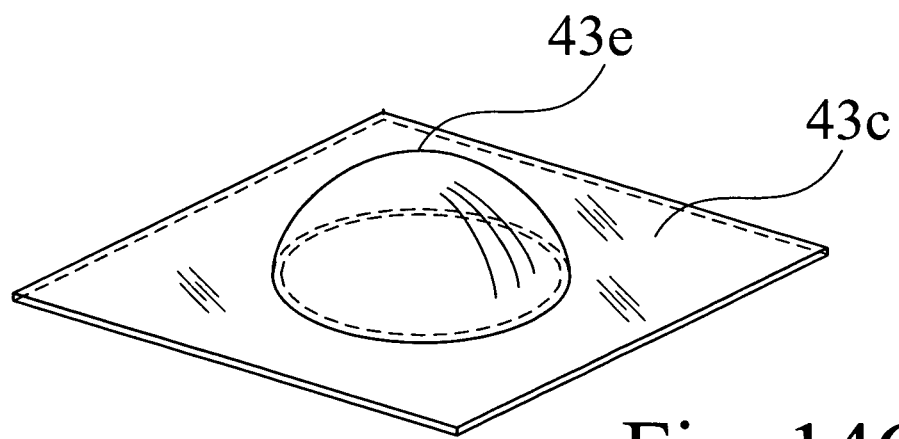

FIGS. 14A, 14B and 14C illustrate an alternative method of the invention that uses a thin layer of semiconductor material that is formed into a generally dome-shaped surface using a mandrel.

Figure 14D:
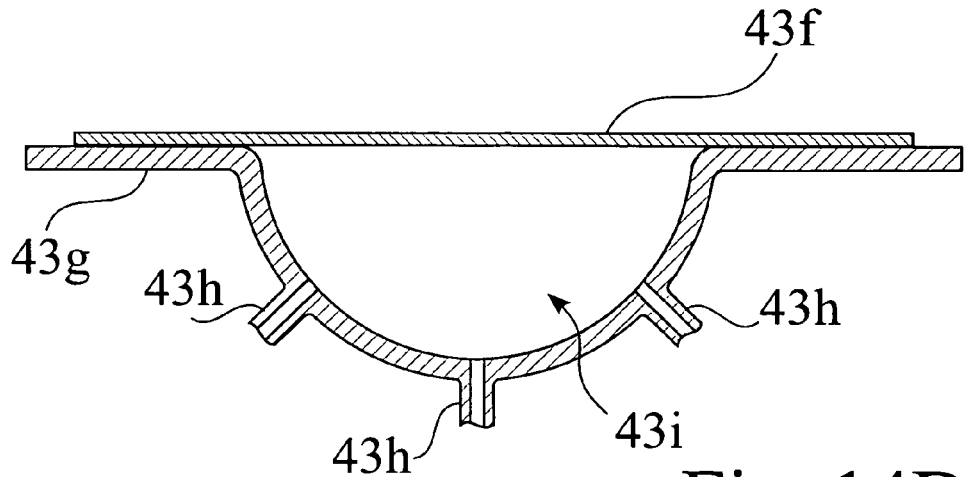
Figure 14E:
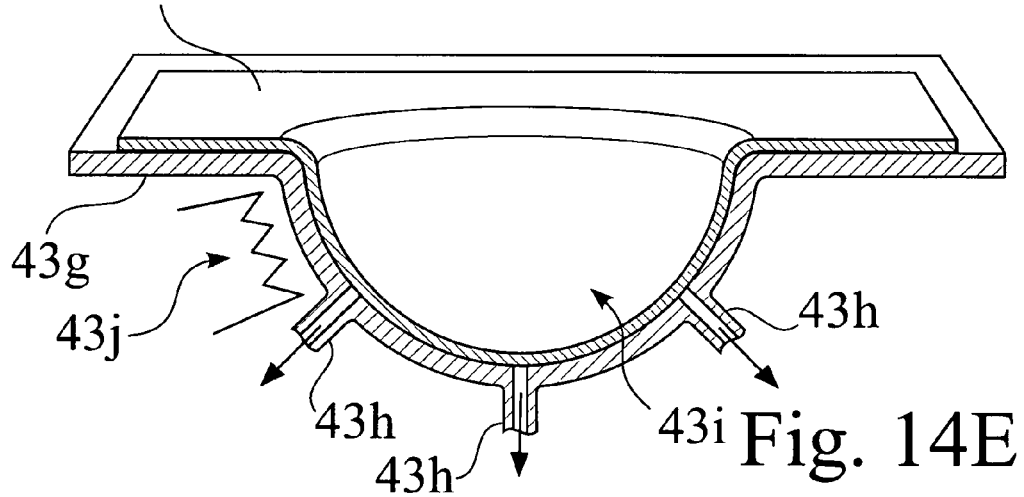
Figure 14F:
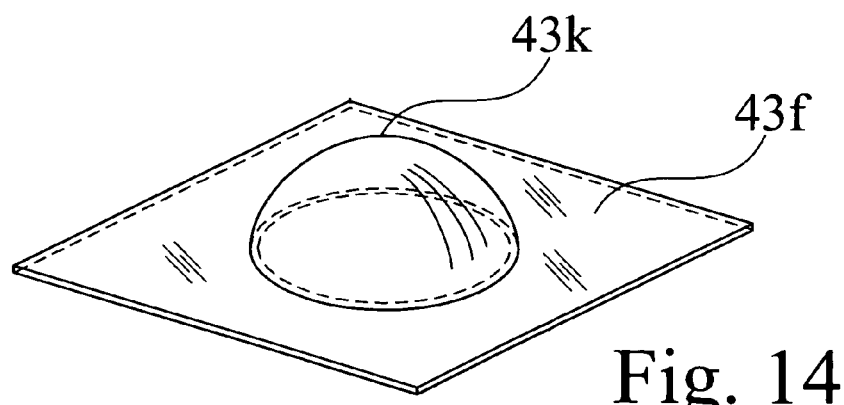

FIGS. 14D, 14E and 14F illustrate methods for formed a generally dome-shaped surface using a mandrel.

Figure 14G:
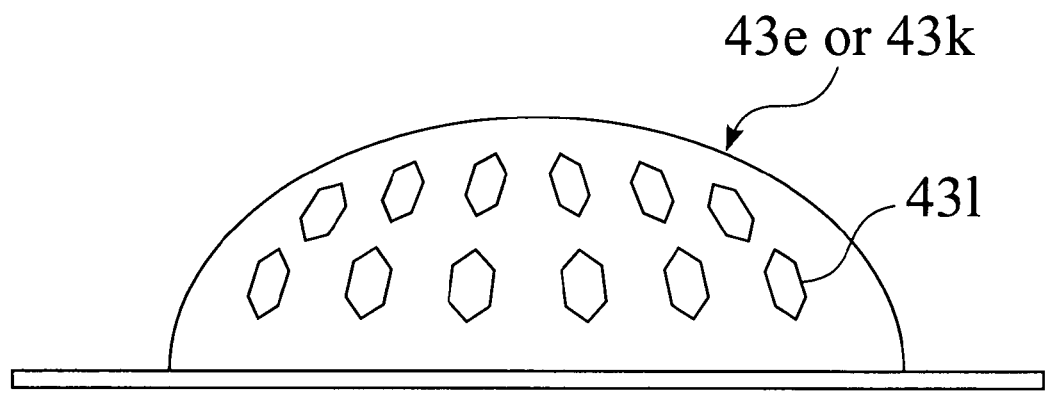

FIG. 14G shows the dome-shaped surface after sensors have been deployed on its surface.

Figure 15A:
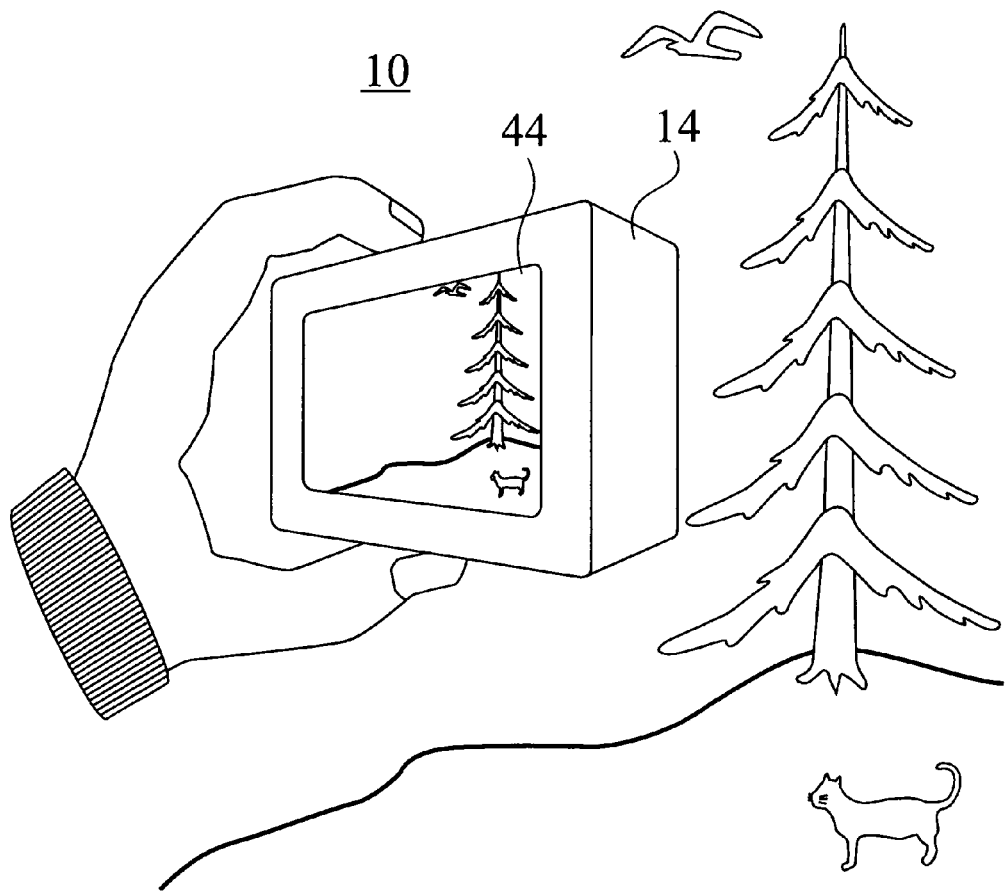

FIG. 15A shows a camera taking a wide angle photo image.

FIG. 15B shows a camera taking a normal perspective photo image.

Figure 15C:
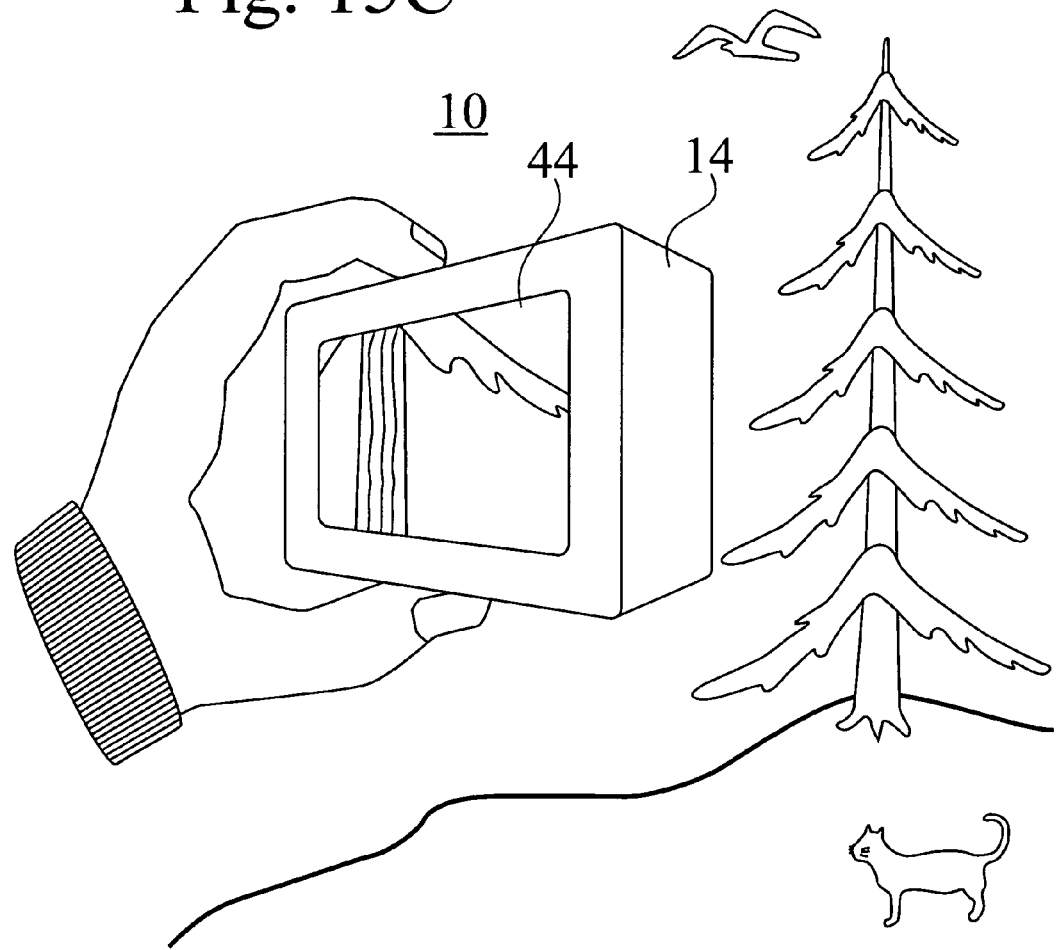

FIG. 15C shows a camera taking a telephoto image.

Figure 16:
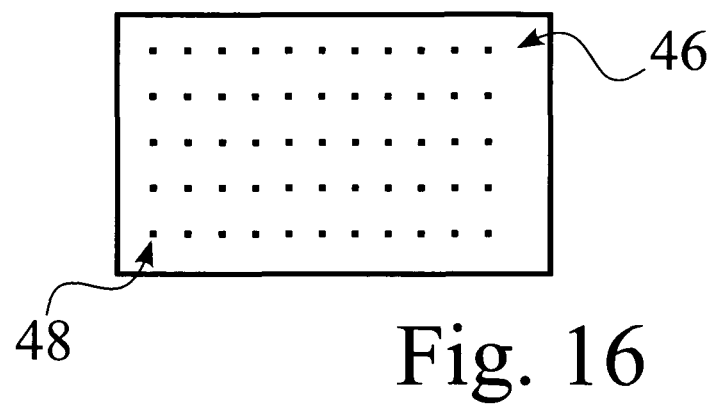
Figure 17:
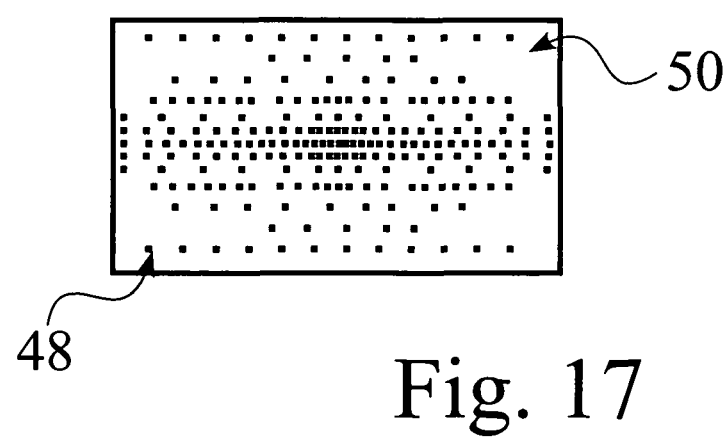

FIGS. 16 and 17 illustrate the feature of variable pixel density by comparing views of a conventional sensor with one of the embodiments of the present invention, where pixels are more concentrated in the center.

FIGS. 18, 19, 20 and 21 provide schematic views of a camera with a retractable and extendable shade. When the camera is used for wide angle shots, the lens shade retracts. For telephoto shots, the lens shade extends. For normal perspectives, the lens shade protrudes partially.

Figure 23:
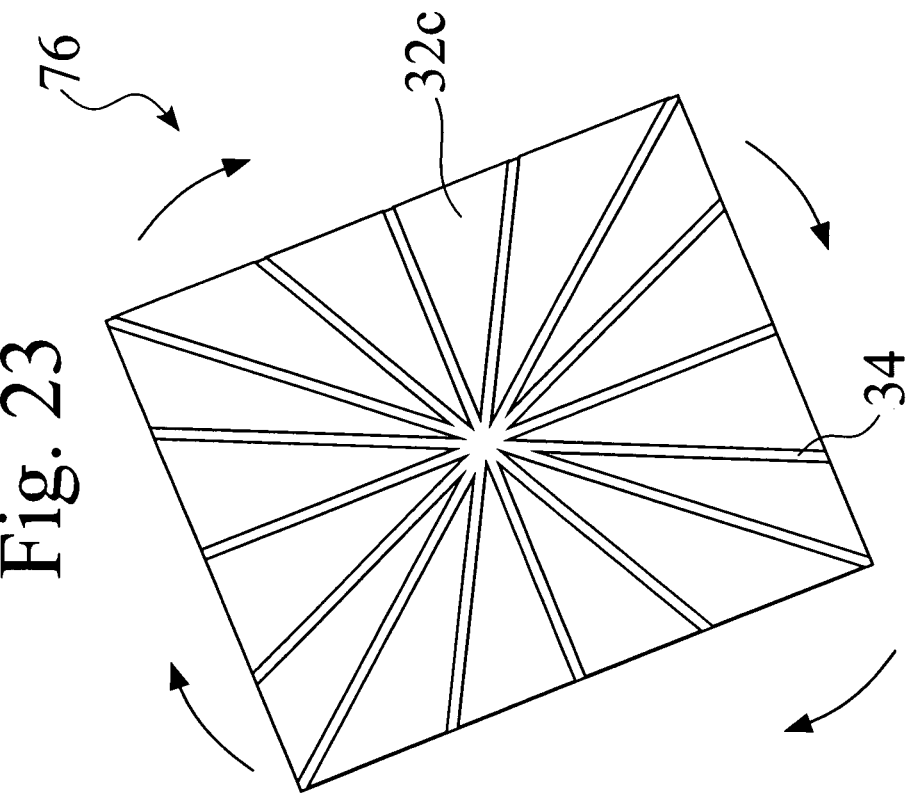
Figure 22:
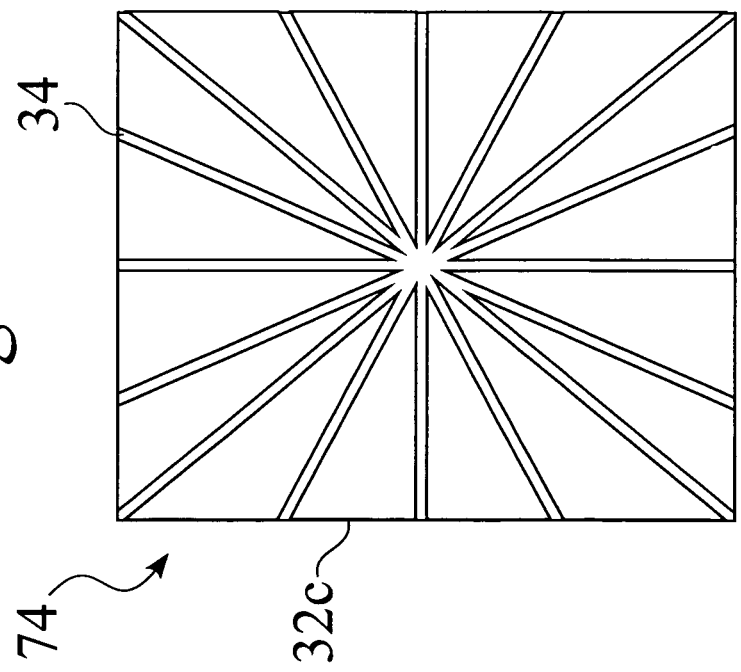

FIGS. 22 and 23 supply two views of a composite sensor. In the first view, the sensor is aligned in its original position, and captures a first image. In the second view, the sensor has been rotated, and captures a second image. The two successive images are combined to produce a comprehensive final image.

Figures 24A, 24B:
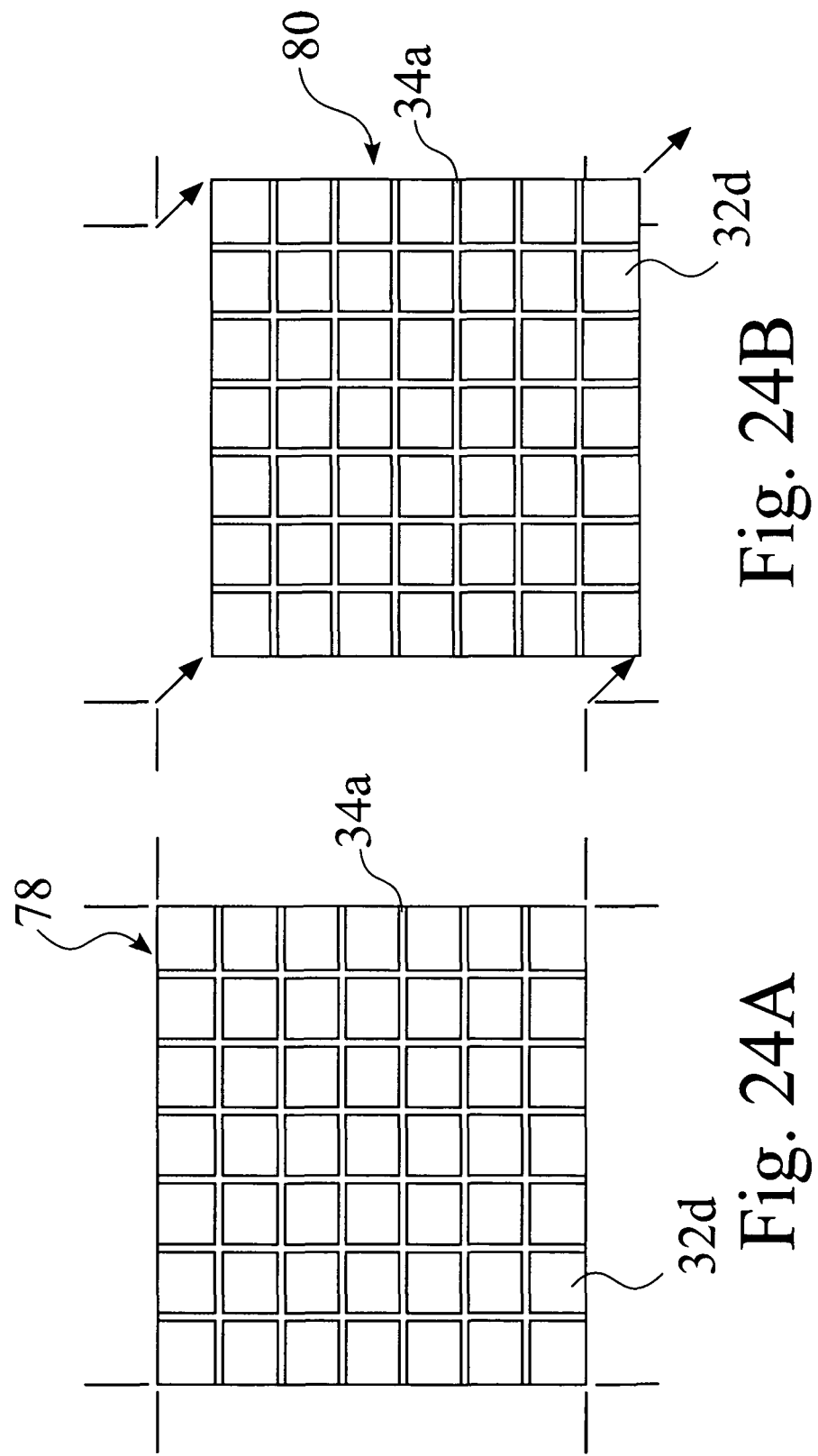
Figure 25A:
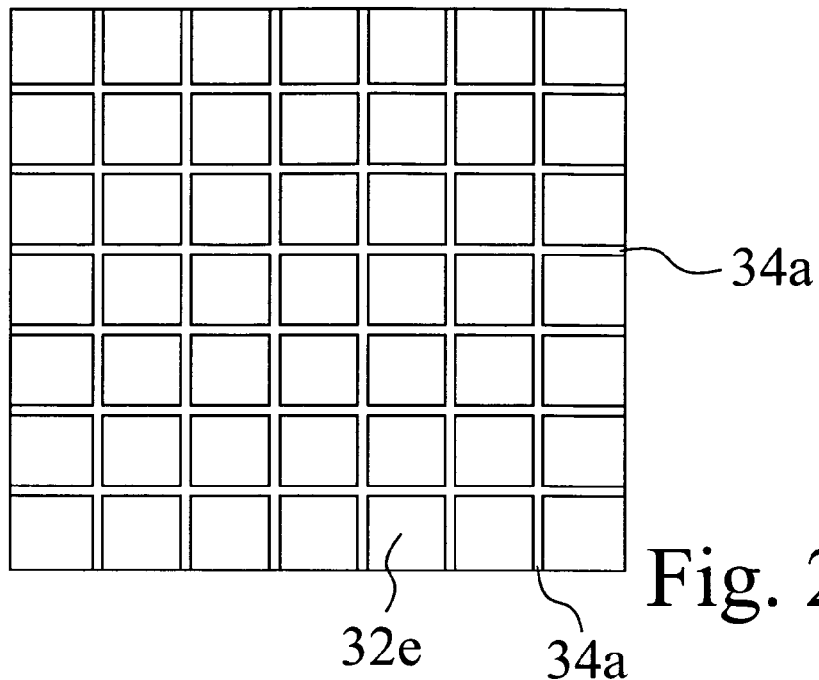
Figure 25B:
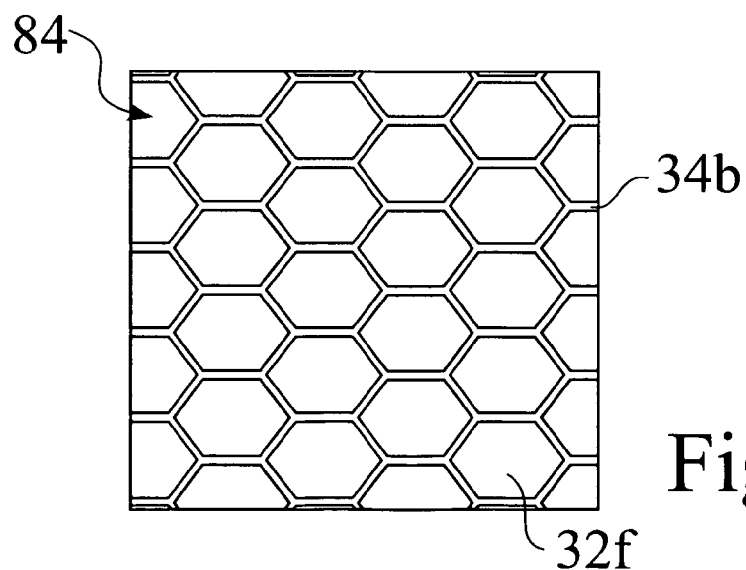
Figure 25C:
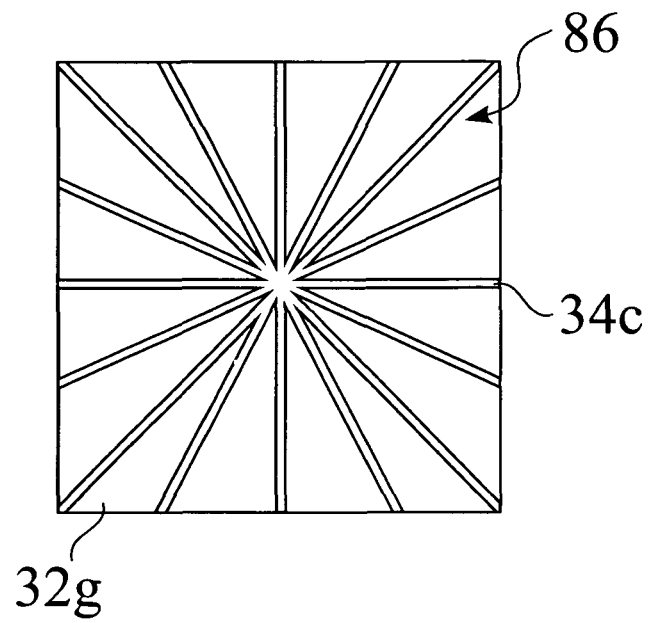
Figure 25D:
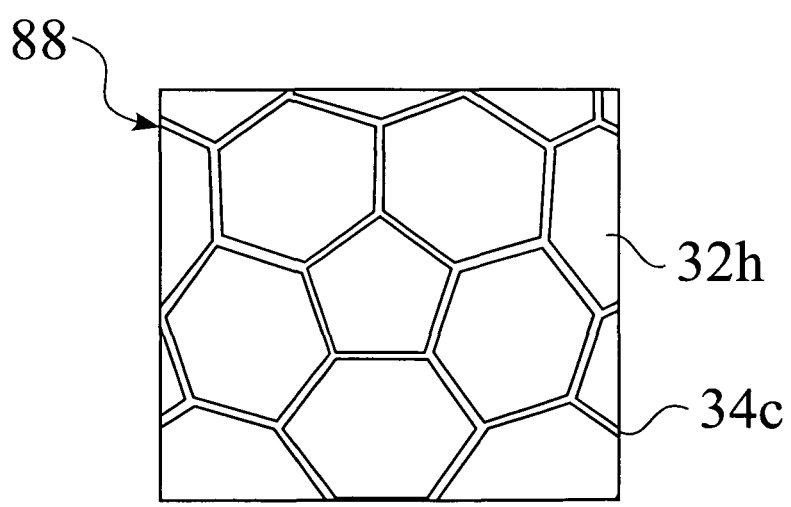

FIGS. 24A and 24B offer an alternative embodiment to that shown in FIGS. 22 and 23, in which the sensor position is displaced diagonally between exposures.

FIGS. 25A, 25B, 25C and 25D offer four views of sensors that include gaps between a variety of arrays of sensor facets.

Figure 26:
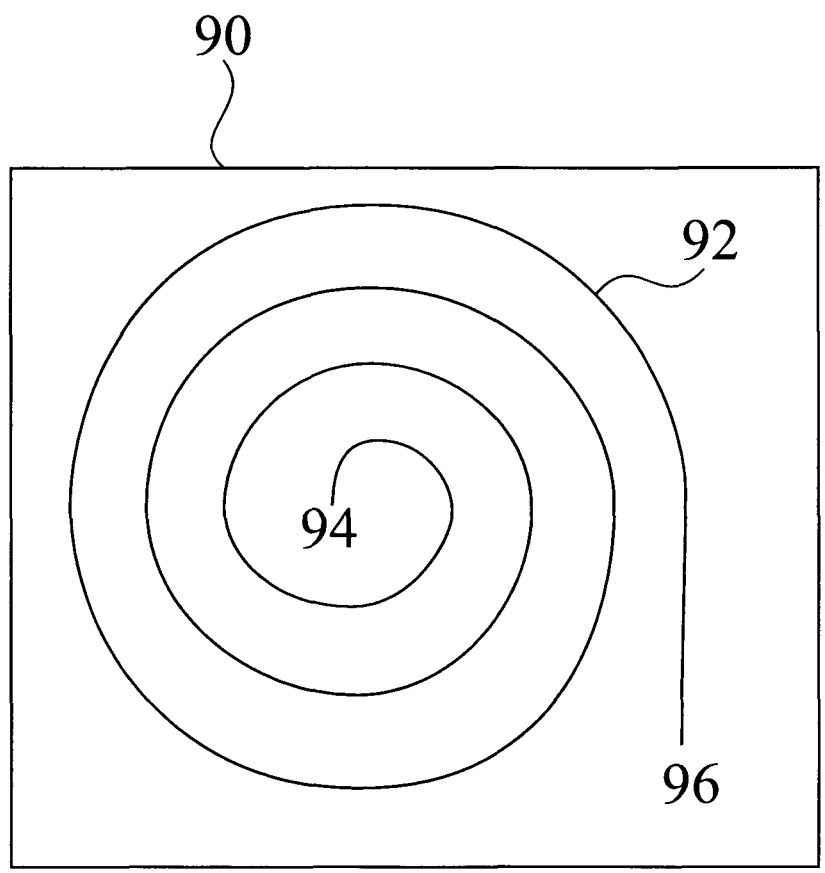
Figure 27:
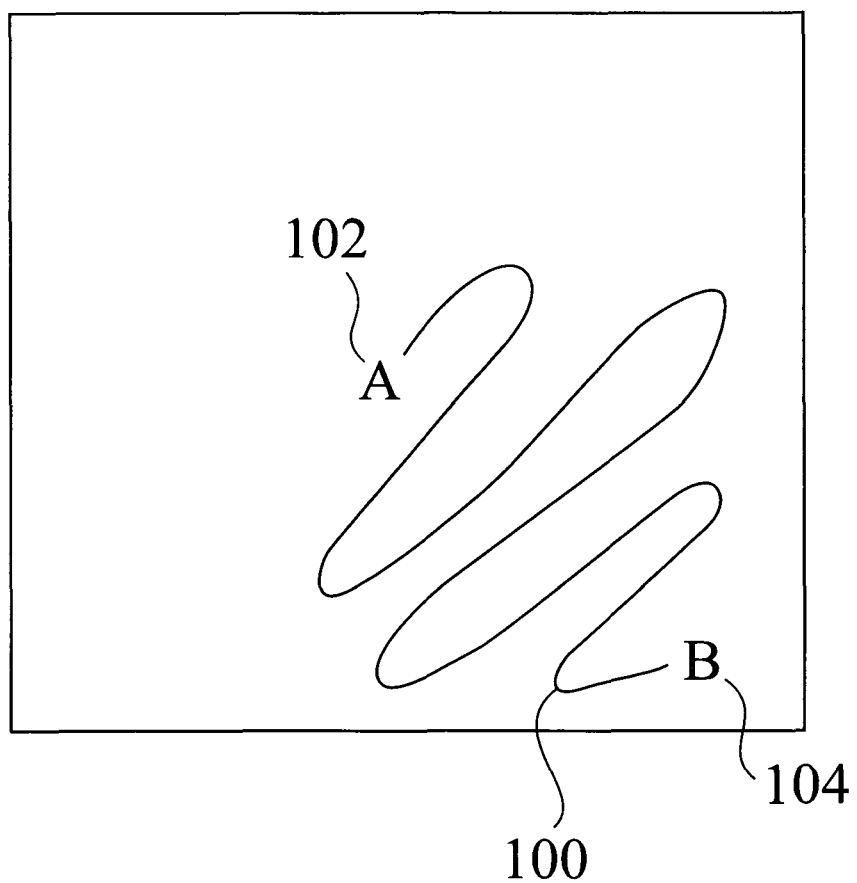
Figure 28:
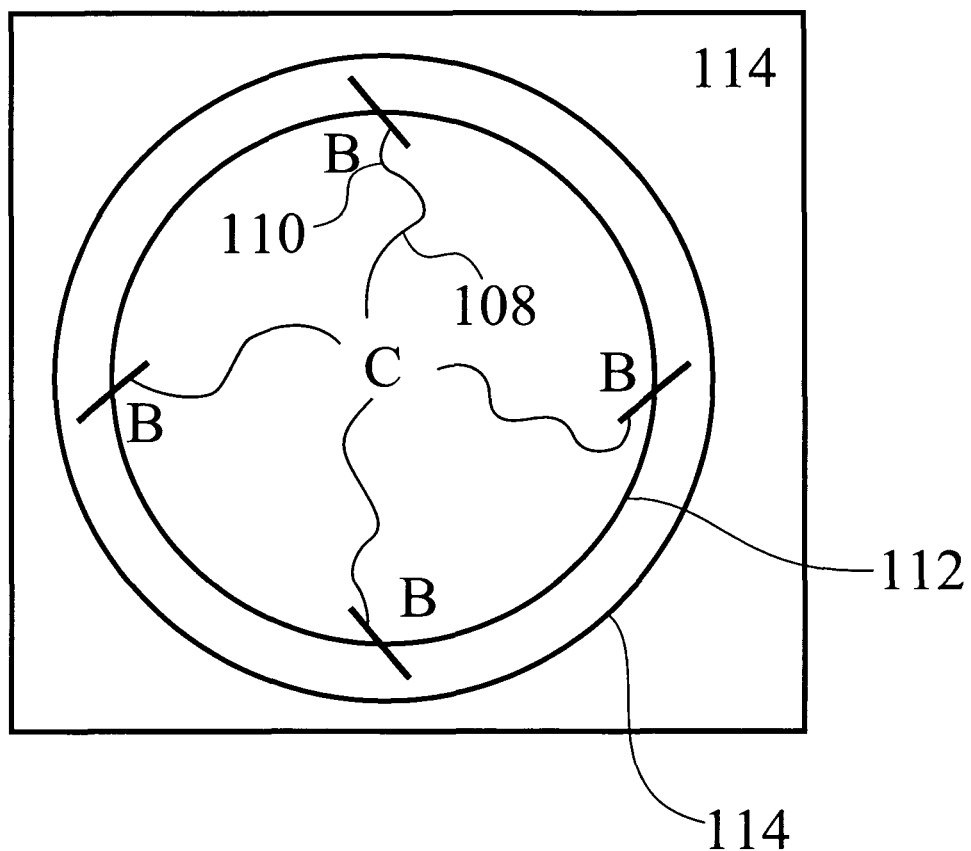

FIGS. 26, 27 and 28 provide illustrations of the back of a moving sensor, revealing a variety of connecting devices which may be used to extract an electrical signal.

Figure 29:
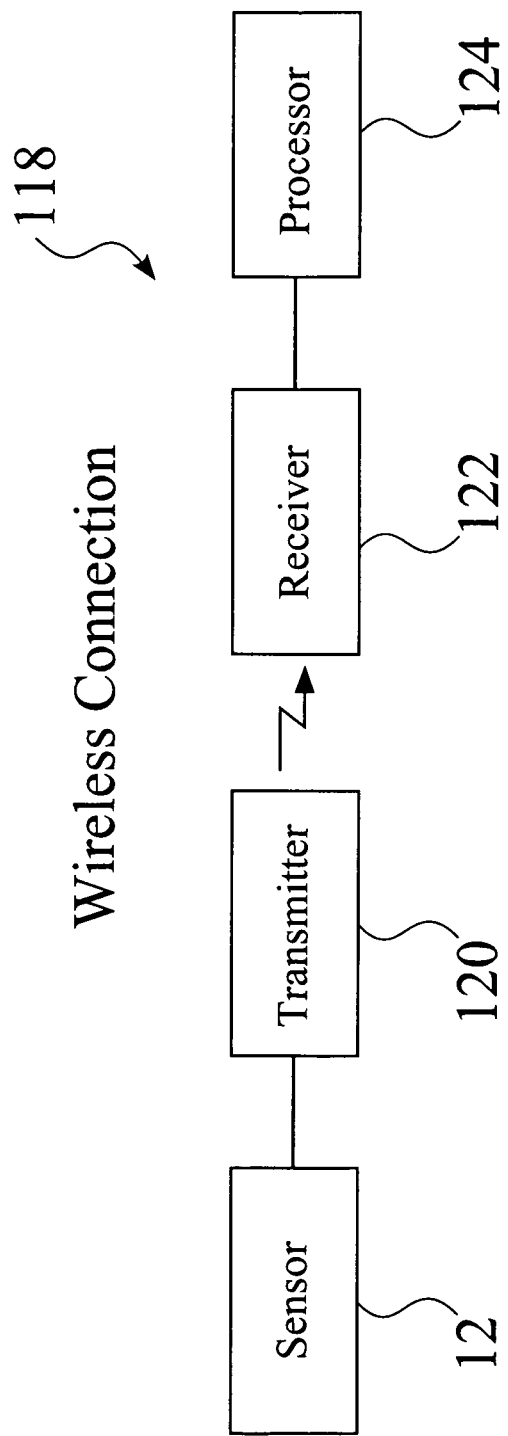

FIG. 29 is a block diagram that illustrates a wireless connection between a sensor and a processor.

Figure 30:
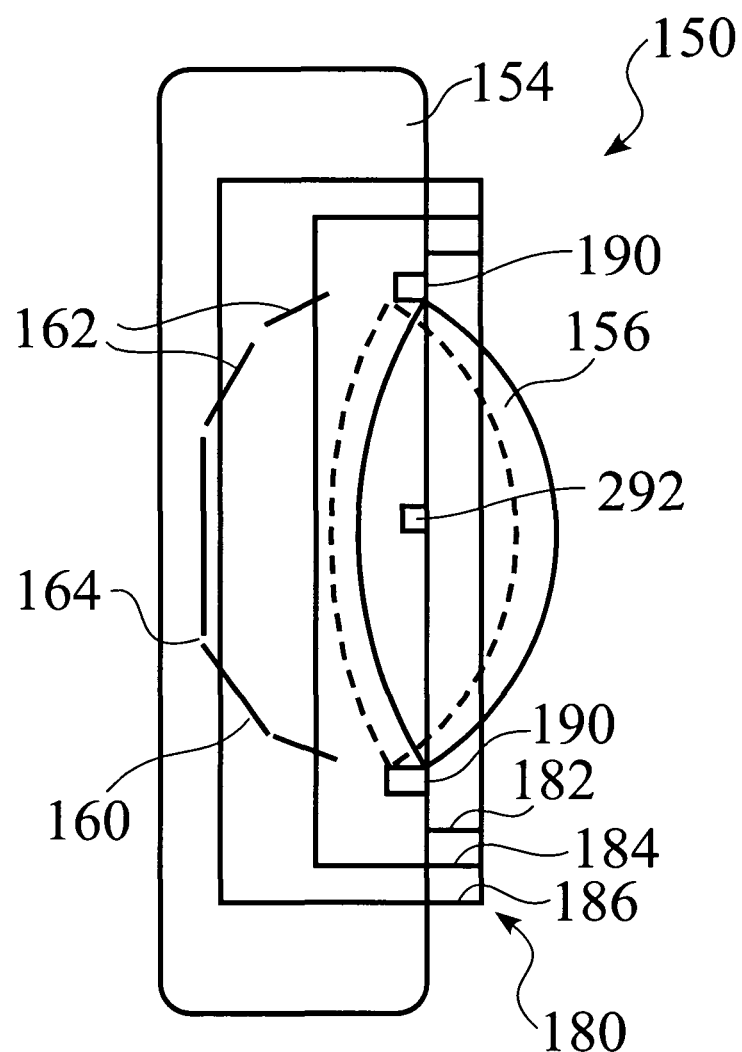

FIG. 30 is a schematic side sectional view of a camera apparatus in accordance with another embodiment of the present invention.

Figure 31:
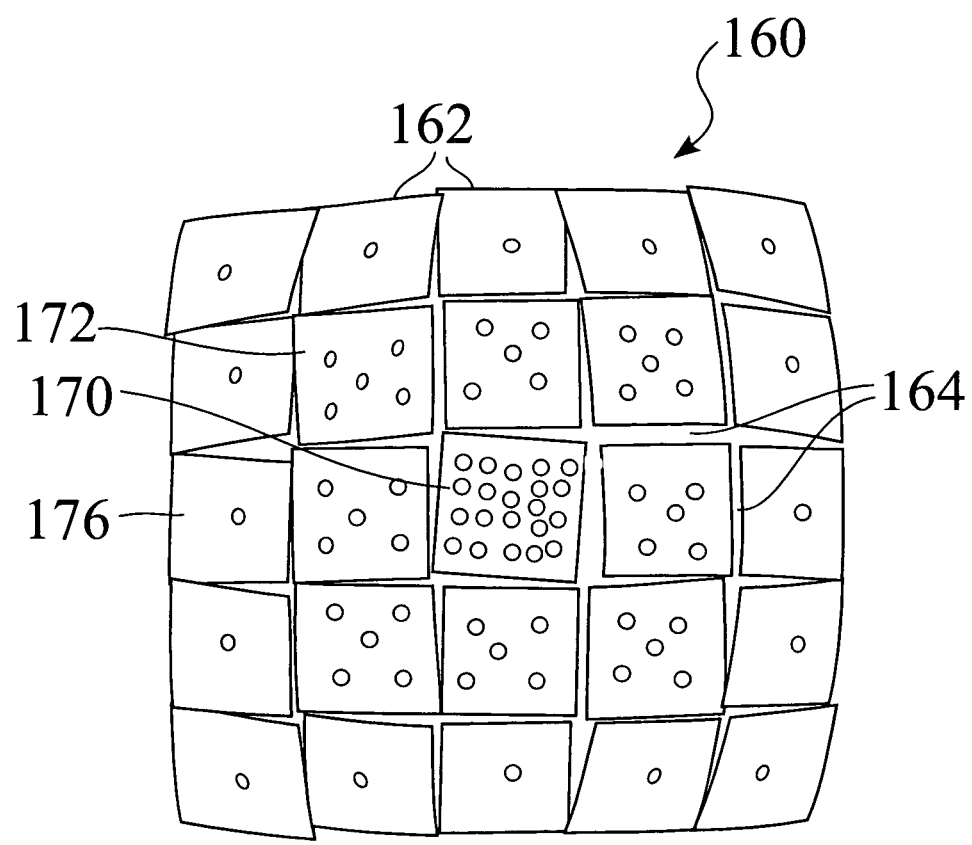

FIG. 31 is a front view of the sensor of the camera apparatus of FIG. 30.

Figure 32:
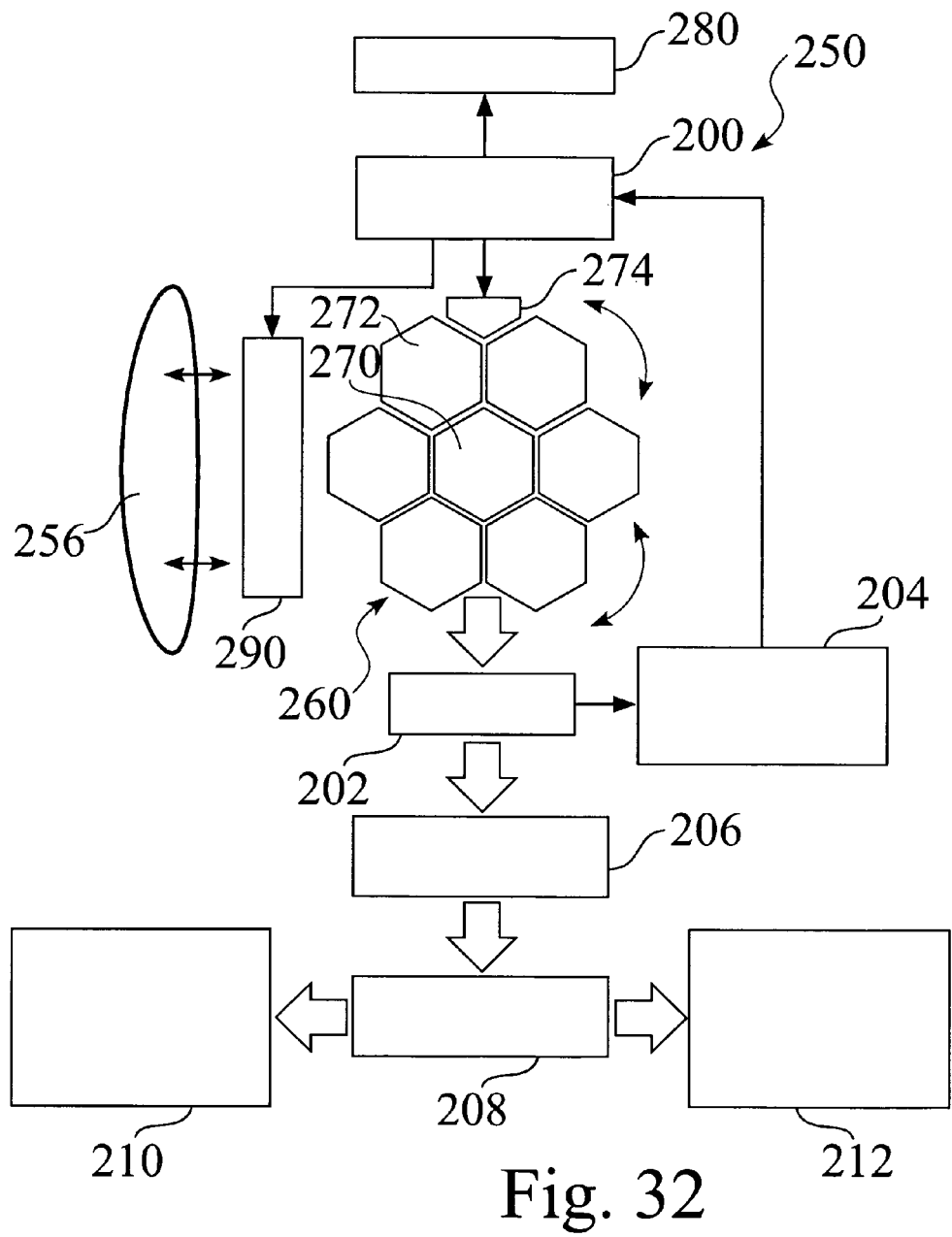

FIG. 32 is a block diagram of a camera apparatus in accordance with a further embodiment of the present invention.

FIGS. 33, 34, 35, 36 and 37 provide various views of an electronic device which incorporates a curved sensor.

FIGS. 38-50 illustrate a method capture more detail from a scene than the sensor is otherwise capable of recording.

A DETAILED DESCRIPTION OF PREFERRED & ALTERNATIVE EMBODIMENTS

I. Overview of the Invention

The present invention provides methods and apparatus related to a mobile communication device which includes a camera having a non-planar, curved or curved sensor. In this Specification, and in the Claims that follow, the terms "mobile communication device" and "mobile communication means" are intended to include any apparatus or combination of hardware and/or software which may be used to communicate, which includes transmitting and/or receiving information, data or content or any other form of signals or intelligence.

Specific examples of mobile communication devices includes cellular or wireless telephones, smart phones, personal digital assistants, laptop or netbook computers, iPads™ or other readers/computers, or any other generally portable device which may be used for telecommunications or viewing or listening to content.

Unlike conventional cellular telephones which include a camera that utilizes a conventional flat sensor, the present invention includes a curved or otherwise non-planar sensor. In one embodiment, the non-planar surfaces of the sensor used in the present invention comprise a plurality of small flat segments which altogether approximate a curved surface. In general, the sensor used by the present invention occupies three dimensions of space, as opposed to conventional sensors, which are planes that are substantially and generally contained in two physical dimensions.

The present invention may utilize sensors which are configured in a variety of three-dimensional shapes, including, but not limited to, spherical, paraboloidal and ellipsoidal surfaces.

In the present Specification, the terms "curvilinear" and "curved" encompass any line, edge, boundary, segment, surface or feature that is not completely colinear with a straight line. The term "sensor" encompasses any detector, imaging device, measurement device, transducer, focal plane array, charge-coupled device (CCD), complementary metal-oxide semiconductor (CMOS) or photocell that responds to an incident photon of any wavelength.

While some embodiments of the present invention are configured to record images in the optical spectrum, other embodiments of the present invention may be used for a variety of tasks which pertain to gathering, sensing and/or recording other forms of radiation. Embodiments of the present invention include systems that gather and/or record color, black and white, infra-red, ultraviolet, x-rays or any other stream of radiation, emanation, wave or particle. Embodiments of the present invention also include systems that record still images or motion pictures.

II. Specific Embodiments of the Invention

FIG. 3 provides a generalized schematic diagram of a digital camera 10 with a curved sensor 12 sub-assembly which may be incorporated into a mobile communication device. A housing 14 has an objective lens 16 mounted on one of its walls. The objective lens 16 receives incoming light 18. In general, the sensor 12 converts the energy of the incoming photons 18 to an electrical output 20, which is then fed to a signal or photon processor 22. The signal processor 22 is connected to user controls 24, a battery or power supply 26 and to a solid state memory 28. Images created by the signal processor 22 are stored in the memory 28. Images may be extracted or downloaded from the camera through an output terminal 30, such as a USB port.

Embodiments of the present invention include, but are not limited to, mobile communication devices with a camera that incorporate the following sensors:

1. Curved sensors: Generally continuous portions of spheres, or revolutions of conic sections such as parabolas or ellipses or other non-planar shapes. Examples of a generally curved sensor 12 appear in FIGS. 4A, 4B and 4C. In this specification, various embodiments of curved sensors are identified with reference character 12, 12a, 12b, 12c, and so on.
2. Faceted sensors: Aggregations of polygonal facets or segments. Any suitable polygon may be used, including squares, rectangles, triangles, trapezoids, pentagons, hexagons, septagons, octagons or others. FIG. 5 exhibits a sensor 12a comprising nine flat polygonal segments or facets 32a. For some applications, a simplified assembly of a few flat sensors might lose most of the benefit of a smoother curve, while achieving a much lower cost. FIGS. 6 and 7 provide side and perspective views of a generally spherical sensor surface 12b comprising a number of flat facets 32b. FIG. 7 shows exaggerated gaps 34 between the facets. The facets could each have hundreds, thousands or many millions of pixels. In this specification, the facets of the sensor 12 are identified with reference characters 32, 32a, 32b, 32c and so on.

FIG. 8 offers a view of the electrical connections 36 for the curved sensor 12b shown in FIG. 7. The semiconductor facet array is disposed on the interior surface. The exterior surface may be a MYLAR™, KAPTON™ or similar wiring backplane formed in a curved shape. Vias provide electrical connections between the facet array and the wiring backplane. In one embodiment, two to two thousand or more electrical pathways may connect the facet array and the wiring backplane.

FIG. 9 provides a detailed view of facets on the curved sensor 12b. In general, the more polygons that are employed to mimic a generally spherical surface, the more the sensor will resemble a smooth curve. In one embodiment of the invention, a wafer is manufactured so that each camera sensor has tessellated facets. Either the front side or the rear side of the wafer of sensor chips is attached to a flexible membrane that may bend slightly (such as MYLAR™ or KAPTON™), but which is sufficiently rigid to maintain the individual facets in their respective locations. A thin line is etched into the silicon chip between each facet, but not through the flexible membrane. The wafer is then shaped into a generally spherical surface. Each facet is manufactured with vias formed through the wafer to connect a rear wiring harness. This harness may also provide mechanical support for the individual facets.

FIGS. 9A and 9B furnish a view of the facets 32b which reside on the interior of the curved sensor, and the electrical interconnects that link the sensor facets with the wiring backplane.

FIGS. 10A and 10B illustrate a wiring backplane 38 which may be used to draw output signals from the facets on the sensor.

FIGS. 11A and 11B show a generally hemispherical shape 40 that has been formed by bending and then joining a number of ultra-thin silicon petal-shaped segments 42. These segments are bent slightly, and then joined to form the curved sensor.

FIG. 12 provides a view of one embodiment of the petal-shaped segments 42. Conventional manufacturing methods may be employed to produce these segments. In one embodiment, these segments are formed from ultra-thin silicon, which are able to bend somewhat without breaking. In this Specification, and in the Claims that follow, the term "ultra-thin" denotes a range extending from 50 to 250 microns. In another embodiment, pixel density is increased at the points of the segments, and are gradually decreased toward the base of each segment. This embodiment may be implemented by programming changes to the software that creates the pixels.

FIG. 13 offers a perspective view of one embodiment of a curved shape that is formed when the segments shown in FIG. 12 are joined. The sensors are placed on the concave side, while the electrical connections are made on the convex side. The number of petals used to form this non-planar surface may comprise any suitable number. Heat or radiation may be employed to form the silicon into a desired shape. The curvature of the petals may be varied to suit any particular sensor design.

In one alternative embodiment, a flat center sensor might be surrounded by these "petals" with squared-off points.

FIGS. 14A, 14B and 14C depict an alternative method for forming a curved sensor. FIG. 14A depicts a dome-shaped first mandrel 43a on a substrate 43b. In FIG. 14B, a thin sheet of heated deformable material 43c is impressed over the first mandrel 43a. The central area of the deformable material 43c takes the shape of the first mandrel 43a, forming a generally hemispherical base 43e for a curved sensor, as shown in FIG. 14C.

FIGS. 14D, 14E and 14F depict an alternative method for forming the base of a curved sensor. In FIG. 14D, a second sheet of heated, deformable material 43f is placed over a second mandrel 43g. A vacuum pressure is applied to ports 43h, which draws the second sheet of heated, deformable material 43f downward into the empty region 43i enclosed by the second mandrel 43g. FIG. 14E illustrates the next step in the process. A heater 43j increases the temperature of the second mandrel 43g, while the vacuum pressure imposed on ports 43h pulls the second sheet of heated, deformable material 43f down against the inside of the second mandrel 43g. FIG. 14F shows the resulting generally hemispherical dome 43k, which is then used as the base of a curved sensor.

FIG. 14G shows a generally hemispherical base 43e or 43k for a curved sensor after sensor pixels 43l have been formed on the base 43e or 43k.

Digital Zoom

FIG. 15A shows a camera taking a wide angle photo. FIG. 15A shows the same camera taking a normal perspective photo, while FIG. 15B shows a telephoto view. In each view, the scene stays the same. The view screen on the camera shows a panorama in FIG. 15A, a normal view in FIG. 15B, and detail from the distance in FIG. 15C. Just as with optical zoom, digital zoom shows the operator exactly the scene that is being processed from the camera sensor.

Digital zoom is software-driven. The camera either captures only a small portion of the central image, the entire scene or any perspective in between. The monitor shows the operator what portion of the overall image is being recorded. When digitally zooming out to telephoto in one embodiment of the present invention, which uses denser pixels in its center, the software can use all the data. Since the center has more pixels per area, the telephoto image, even though it is cropped down to a small section of the sensor, produces a crisp image. This is because the pixels are more dense at the center.

When the camera has "zoomed back" into a wide angle perspective, the software can compress the data in the center to approximate the density of the pixels in the edges of the image. Because so many more pixels are involved in the center of this wide angle scene, this does not effect wide angle image quality. Yet, if uncompressed, the center pixels represent unnecessary and invisible detail captured, and require more storage capacity and processing time. Current photographic language might call the center section as being processed "RAW" or uncompressed when shooting telephoto but being processed as "JPEG" or other compression algorithm in the center when the image is wide angle.

Digital zoom is currently disdained by industry experts. When traditional sensors capture an image, digital zooming creates images that break up into lines, forms visible pixels and yields poor resolution.

Optical zoom has never created images as sharp as fixed focus length lenses are capable of producing. Optical zooms are slower, letting less light through the optical train.

Embodiments of the present invention provide lighter, faster, cheaper and more dependable cameras. In one embodiment, the present invention provides digital zoom. Since this does not require optical zoom, it uses inherently lighter lens designs with fewer elements.

In various embodiments of the invention, more pixels are concentrated in the center of the sensor, and fewer are placed at the edges of the sensor. Various densities may be arranged in between the center and the edges. This feature allows the user to zoom into a telephoto shot using the center section only, and still have high resolution.

When viewing the photograph in the wide field of view, the center pixels are "binned" or summed together to normalize the resolution to the value of the outer pixel density.

When viewing the photograph in telephoto mode, the center pixels are utilized in their highest resolution, showing maximum detail without requiring any adjustment of lens or camera settings.

The digital zoom feature offers extra wide angle to extreme telephoto zoom. This feature is enabled due to the extra resolving power, contrast, speed and color resolution lenses are able to deliver when the digital sensor is not flat, but curved, somewhat like the retina of a human eye. The average human eye, with a cornea and single lens element, uses, on average, 25 million rods and 6 million cones to capture images. This is more image data than is captured by all but a rare and expensive model or two of the cameras that are commercially available today, and those cameras typically must use seven to twenty element lenses, since they are constrained by flat sensors. These cameras cannot capture twilight images without artificial lighting. These high-end cameras currently use sensors with up to 43 millimeter diagonal areas, while the average human eyeball has a diameter of 25 millimeters. Eagle eyes, which are far smaller, have eight times as many sensors as a human eye, again showing the optical potential that a curved sensor or retina provides. Embodiments of the present invention are more dependable, cheaper and provide higher performance. Interchangeable lenses are no longer necessary, which eliminates the need for moving mirrors and connecting mechanisms. Further savings are realized due to simpler lens designs, with fewer elements, because flat film and sensors, unlike curved surfaces, are at varying distances and angles from the light coming from the lens. This causes chromatic aberrations and varying intensity across the sensor. To compensate for that, current lenses, over the last two centuries, have mitigated the problem almost entirely, but, with huge compromises. Those compromises include limits on speed, resolving power, contrast, and color resolution. Also, the conventional lens designs require multiple elements, some aspheric lenses, exotic materials and special coatings for each surface. Moreover, there are more air to glass surfaces and more glass to air surfaces, each causing loss of light and reflections.

Variable Density of Pixels

In some embodiments of the present invention, the center of the sensor, where the digitally zoomed telephoto images are captured, is configured with dense pixilation, which enables higher quality digitally zoomed images.

FIGS. 16 and 17 illustrate this feature, which utilizes a high density concentration of pixels 48 at the center of a sensor. By concentrating pixels near the central region of the sensor, digital zoom becomes possible without loss of image detail. This unique approach provides benefits for flat or curved sensors. In FIG. 16, a conventional sensor 46 is shown, which has pixels 48 that are generally uniformly disposed over the surface of the sensor 46. FIG. 17 shows a sensor 50 produced in accordance with the present invention, which has pixels 48 that are more densely arranged toward the center of the sensor 50.

In another embodiment of the invention, suitable software compresses the dense data coming from the center of the image when the camera senses that a wide angle picture is being taken. This feature greatly reduces the processing and storage requirements for the system.

Lens Shade

Other embodiments of the invention include a lens shade, which senses the image being captured, whether wide angle or telephoto. When the camera senses a wide angle image, it retracts the shade, so that the shade does not get into the image area. When it senses the image is telephoto, it extends, blocking extraneous light from the non-image areas, which can cause flare and fogged images.

Figure 18:
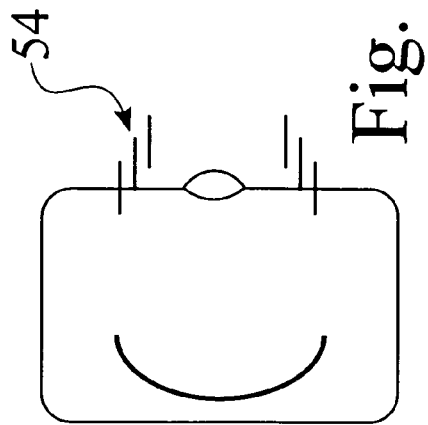
Figure 19:
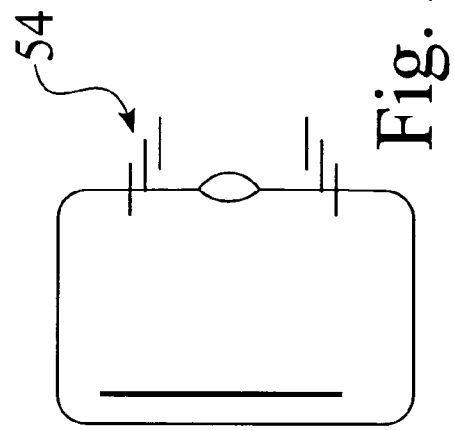

FIGS. 18 and 19 provide views of a camera equipped with an optional retractable lens shade. For wide angle shots, the lens shade is retracted, as indicated by reference character 52. For telephoto shots, the lens shade is extended, as indicated by reference character 54.

Figure 20:
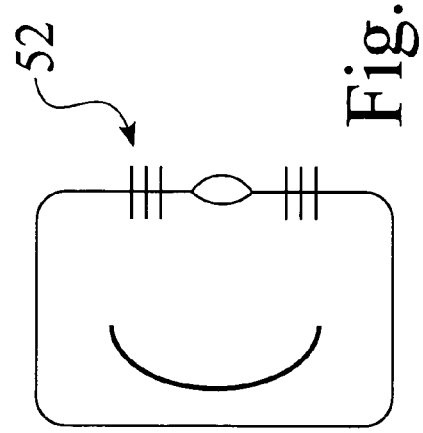
Figure 21:
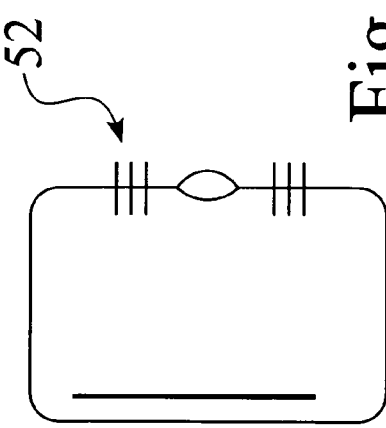

FIGS. 20 and 21 provide similar views to FIGS. 18 and 19, but of a camera with a planar sensor, indicating that the lens shade feature is applicable independently.

Dust Reduction

Embodiments of the present invention reduce the dust problem that plagues conventional cameras since no lens changes are needed. Accordingly, the camera incorporated into the mobile communication device is sealed. No dust enters to interfere with image quality. An inert desicate gas, such as argon, may be sealed in the lens and sensor chambers within the enclosure 14, reducing oxidation and condensation. If argon is used, the camera gains some benefits from argon's thermal insulating capability and temperature changes will be moderated, and the camera can operate over a wider range of temperatures.

Improved Optical Performance

The present invention may be used in conjunction with a radically high speed lens, useable for both surveillance without flash (or without floods for motion) or fast action photography. This becomes possible again due to the non-planar sensor, and makes faster ranges like a f/0.7 or f/0.35 lens designs, and others, within practical reach, since the restraints posed by a flat sensor (or film) are now gone.

All these enhancements become practical since new lens formulas become possible. Current lens design for flat film and sensors must compensate for the "rainbow effect" or chromatic aberrations at the sensor edges, where light travels farther and refracts more. Current lens and sensor designs, in combination with processing algorithms, have to compensate for the reduced light intensity at the edges. These compensations limit the performance possibilities.

Since the camera lens and body are sealed, an inert gas like argon can be inserted, e.g., injected during final assembly, reducing corrosion and rust. The camera can then operate in a wider range of temperatures.

Rotating & Shifted Sensors

FIGS. 22 and 23 illustrate a series of alternative sensor arrays with sensor segments 32c separated by gaps 34, to facilitate easier sensor assembly. In this embodiment, a still camera which utilizes this sensor array takes two pictures in rapid succession. A first sensor array is shown in its original position 74, and is also shown in a rotated position 76. The position of the sensor arrays changes between the times the first and second pictures are taken. Software is used to recognize the images missing from the first exposure, and stitches that data in from the second exposure. The change in the sensor motion or direction shift may vary, depending on the pattern of the sensor facets.

A motion camera can do the same, or, in a different embodiment, can simply move the sensor and capture only the new image using the data from the prior position to fill in the gaps.

This method captures an image using a moveable sensor with gaps between the sensors in its array of sensors. This method makes fabricating much easier, because the spaces between segments become less critical. So, in one example, a square sensor in the center is surrounded by a row of eight more square sensors, which, in turn, is surrounded by another row of sixteen square sensors. The sensors are sized to fit the circular optical image, and each row curves in slightly more, creating the non-planar total sensor.

In use, the camera first takes one picture. The sensor immediately rotates or shifts slightly and a second image is immediately captured. Software can tell where the gaps were and stitches the new data from the second shot into the first. Or, depending on the sensor's array pattern, it may shift linearly in two dimensions, and possibly move in an arc in the third dimension to match the curve.

This concept makes the production of complex sensors easier. The complex sensor, in this case, is a large sensor comprising multiple smaller sensors. When such a complex sensor is used to capture a focused image, the gaps between each sensor lose data that is essential to make the complete image. Small gaps reduce the severity of this problem, but smaller gaps make the assembly of the sensor more difficult. Larger gaps make assembly easier and more economical, but, create an even less complete image. The present method, however, solves that problem by moving the sensor after the first image, and taking a second image quickly. This gives the complete image and software can isolate the data that is collected by the second image that came from the gaps and splice it into the first image.

The same result may be achieved by a tilting lens element that shifts the image slightly during the two rapid sequence exposures. In this embodiment, the camera uses, but changes in a radical way, an industry technique known as "image stabilization." The camera may use image stabilization in both the first and second images. This method neutralizes the effect of camera motion during an exposure. Such motion may come from hand tremors or engine vibrations. However, in this embodiment, after the first exposure, the camera will reverse image stabilization and introduce "image de-stabilization" or "intentional jitter" to move the image slightly over the sensor for the second exposure. This, with a sensor fixed in its position, also gives a shift to the second exposure so the gaps between the facets from the first exposure can be detected, and, the missing imagery recorded and spliced into the final image.

In one example shown in FIG. 23, the sensor rotates back and forth. In an alternative embodiment, the sensor may shift sideways or diagonally, or may vary its degree of curvature. In yet another embodiment, the sensor might rotate continuously, while the software combines the data into a complete image.

FIGS. 24A and 24B also shows a second set of sensors. The sensor is first shown in its original position 78, and is then shown in a displaced position 80.

Sensor Grid Patterns

FIGS. 25A, 25B, 25C and 25D reveal four alternative grid patterns for four alternative embodiments of sensors 82, 84, 86 and 88. The gaps 34 between the facets 32e, 32f, 32g and 32h enable the manufacturing step of forming a curved sensor.

Electrical Connections to Sensors

FIGS. 26, 27 and 28 provide views of alternative embodiments of electrical connections to sensors.

FIG. 26 shows a sensor 90 has a generally spiral-shaped electrical connector 92. The conductor is connected to the sensor at the point identified by reference character 94, and is connected to a signal processor at the point identified by reference character 96. This embodiment of an electrical connection may be used when the sensor is rotated slightly between a first and second exposure, as illustrated in FIG. 23. This arrangement reduces the flexing of the conductor 92, extending its life. The processor may built into the sensor assembly.

FIG. 27 shows the back of a sensor 102 with an "accordion" shape conductor 100, which is joined to the sensor at point A and to a processor at point B. This embodiment may be used when the sensor is shifted but not rotated between a first and second exposure, as illustrated in FIG. 24.

This type of connection, like the coiled wire connection, makes a 20 back and forth sensor connection durable.

FIG. 28 shows the back of a sensor 114 having generally radially extending conductors. The conductors each terminate in brush B which are able to contact a ring. The brushes move over and touch the ring, collecting an output from the rotating sensor, and then transmit the output to the processor at the center C. This embodiment may be used when the sensor is rotated between exposures. In addition, this connection makes another embodiment possible; a continuously rotating sensor. In that embodiment, the sensor rotates in one direction constantly. The software detects the gaps, and fills in the missing data from the prior exposure.

Wireless Connection

FIG. 29 offers a block diagram of a wireless connection 118. A sensor 12 is connected to a transmitter 120, which wirelessly sends signals to a receiver 122. The receiver is connected to a signal processor 124.

In summary, the advantages offered by the present invention include, but are not limited to:
High resolution digital zoom
Faster
Lighter
Cheaper
Longer focusing ranges
More reliable
Lower chromatic aberration
More accurate pixel resolution
Eliminate need for flash or floodlights
Zooming from wide angle to telephoto III. Additional Embodiments A mobile communication device including a camera 150 having many of the preferred features of the present invention will now be described with reference to FIGS. 30 and 31.

It will be understood that numerous conventional features such as a battery, shutter release, aperture monitor and monitor screen have been omitted for the purposes of clarity.

The camera comprises an hermetically-sealed enclosure 154 accommodating a generally curved sensor 160 and a lens 156. Enclosure 154 is filled with argon. A front view of the sensor 160 is illustrated schematically in FIG. 31 and comprises a plurality of flat square pixel elements or facets 162 arranged to be relatively inclined so as to form an overall curved configuration. To minimize the area of the substantially triangular gaps 164 which result between the elements 162, the center square 170 is the largest, and the adjacent ring of eight squares 172 is made of slightly smaller squares so that they touch or nearly touch at their outermost corners. The next ring of sixteen squares 176 has slightly smaller squares than the inner ring 172.

The center square 170 has the highest density of pixels; note that this square alone is used in the capture of telephoto images. The squares of inner ring 172 have medium density pixilation, which for normal photography gives reasonable definition. The outer ring 176 of sixteen squares has the least dense pixel count.

The gaps 164 between the elements 162 are used as pathways for electrical connectors.

The camera 150 further comprises a lens shade extender arrangement 180 comprising a fixed, inner shade member 182, first movable shade member 184 and a second, radially outermost, movable shade member 186. When the operator is taking a wide angle photograph, the shade members are in a retracted disposition as shown in FIG. 30; only stray light from extremely wide angles is blocked. In this mode, to reduce data processing time and storage requirements, the denser pixel data from the central portions 170, 172 of the curved sensor can be normalized across the entire image field to match the less dense pixel counts of the edge facets 176 of the sensor.

For a normal perspective photograph, the shade member 184 is extended so that stray light from outside of the viewing area is blocked. In this mode, a portion of the data facets 172 of the curved sensor are compressed. To reduce processing time and storage requirements, the data from the most center area 170, with higher density of pixels, can be normalized across the entire image field.

When the user zooms out digitally to a telephoto perspective, shade member 186 is extended. In this mode, only the center portion 170 of the curved sensor 160 is used. Since only that sensor center is densely covered with pixels, the image definition will be crisp.

In operation, camera 150 uses two exposures to fill in any gaps within the sensors range, i.e., to obtain the pixel data missing from a single exposure due to the presence of gaps 164. For this purpose, the camera deploys one of two methods. In the first, as previously described, the sensor moves and a second exposure is taken in rapid succession. The processing software detects the image data that was missed in the first exposure, due to the sensor's gaps, and "stitches" that missing data into the first exposure. This creates a complete image. The process is run continuously for motion pictures, with the third exposure selecting missing data from either the preceding or the following exposure, again to create a complete image.

In the second method, a radical change to the now-standard process known in the industry as "image stabilization" is used. For the first exposure, the image is stabilized. Once recorded, this "image stabilization" is turned off, the image is shifted by the stabilization system, and the second image is taken while it is re-stabilized. In this method, a complete image is again created, but without any motion required of the sensor.

The dashed lines shown in FIG. 30 indicate the back and forth motion of the lens for one embodiment of the focusing process.

In another embodiment that includes image stabilization, the lens does not move for that purpose.

In another embodiment of the invention that includes intentional jittering, the lens does not move back and forth, but, rather, tilts to alter the position of the image on the sensor.

The above-described camera 150 has numerous advantages. The sealing of the enclosure 154 with a gas like argon prevents oxidation of the parts and provides thermal insulation for operation throughout a broader range of temperature.

Although the center square 170 with a high pixel density is relatively expensive, it is relatively small and it is only necessary to provide a single such square, this keeping down the overall cost. A significant advantage is that it provides an acceptable digital zoom without the need for accessory lenses. The outer ring 176 has the smallest squares and the lowest pixel count and so they are relatively inexpensive. Thus, taking into account the entire assembly of squares, the total cost of the sensor is low, bearing in mind it is capable of providing an acceptable performance over a wide range of perspectives.

Numerous modifications may be made to the camera 150. For example, instead of being monolithic, lens 156 may comprise a plurality of elements.

The enclosure 154 is sealed with another inert gas, or a non-reactive gas such as nitrogen, or it may not be sealed at all.

This sequence of operations is usually undertaken rapidly, but certain applications (for example astrophotography) only need relatively slow transition times. Multiple exposures can also be used to eliminate noise from the sensor, as each exposure can be averaged out and/or different pixels can be used to capture the same image element.

If the lens is a multi-element lens, image stabilization and destabilization may be effected by movement of these elements, so that mechanisms 190 and 292 are not needed for this purpose.

The pixels or facets 170, 172, 176 may be rectangular, hexagonal or of any other suitable shape. Squares and rectangles are easiest to manufacture. Although a central pixel and two surrounding rings of pixels are described, the sensor may comprise any desired number of rings.

In FIG. 32, there is shown a block diagram of a camera 250 having many of the features of the camera 150 of FIGS. 30 and 31. A non-planar sensor 260, has a central region 270 with high pixel density and a surrounding region comprising facets 272 with low pixel density. A shutter control 274 is also illustrated. The shutter control 274 together with a focus/stabilization actuating mechanism 290 for lens 256 and a lens shade actuator 280 are controlled by an image sequence processor 200. The signals from pixels in facets 270, 272 are supplied to a raw sensor capture device 202. An output of device 202 is connected to a device 204 for effecting auto focus, auto exposure/gain and auto white balance. Another output of device 202 is supplied to a device 206 for effecting pixel density normalization, the output of which is supplied to an image processing engine 208. A first output of engine 208 is supplied to a display/LCD controller 210. A second output of engine 208 is supplied to a compression and storage controller 212.

The features and modifications of the various embodiments described may be combined or interchanged as desired.

IV. Mobile Communicator with a Curved Sensor Camera

FIGS. 33, 34, 35 and 36 present views of one embodiment of the invention, which combines a mobile communication device. The device may be a cellular telephone; laptop, notebook or netbook computer; or any other appropriate device or means for communication, recordation or computation.

Figure 33:
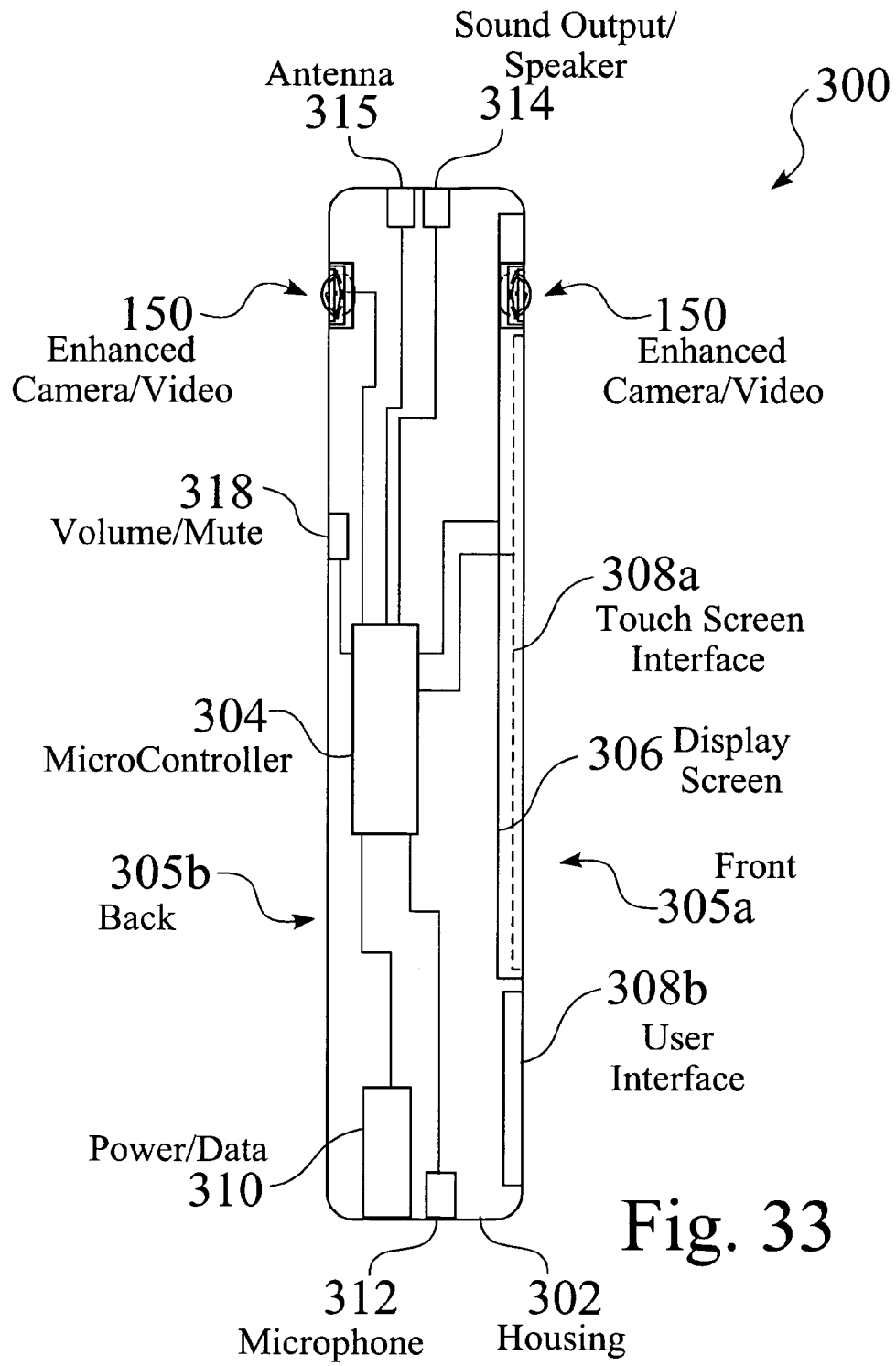

FIG. 33 shows a side view 300 of one particular embodiment of the device, which includes an enhanced camera 150 for still photographs and video on both the front 305a and the back 305b sides. A housing 302 encloses a micro-controller 304, a display screen 306, a touch screen interface 308a and a user interface 308b. A terminal for power and/or data 310, as well as a microphone, are located near the bottom of the housing 302. A volume and/or mute control switch 318 is mounted on one of the slender sides of the housing 302. A speaker 314 and an antenna 315 reside inside the upper portion of the housing 302.

Figure 34:
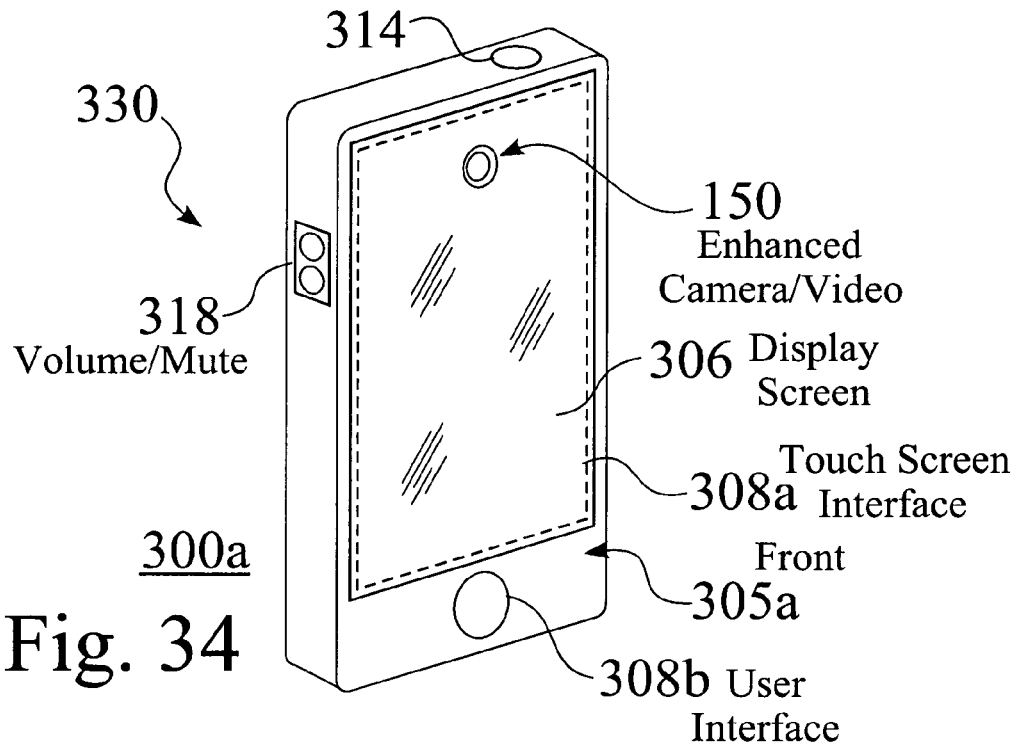
Figure 35:
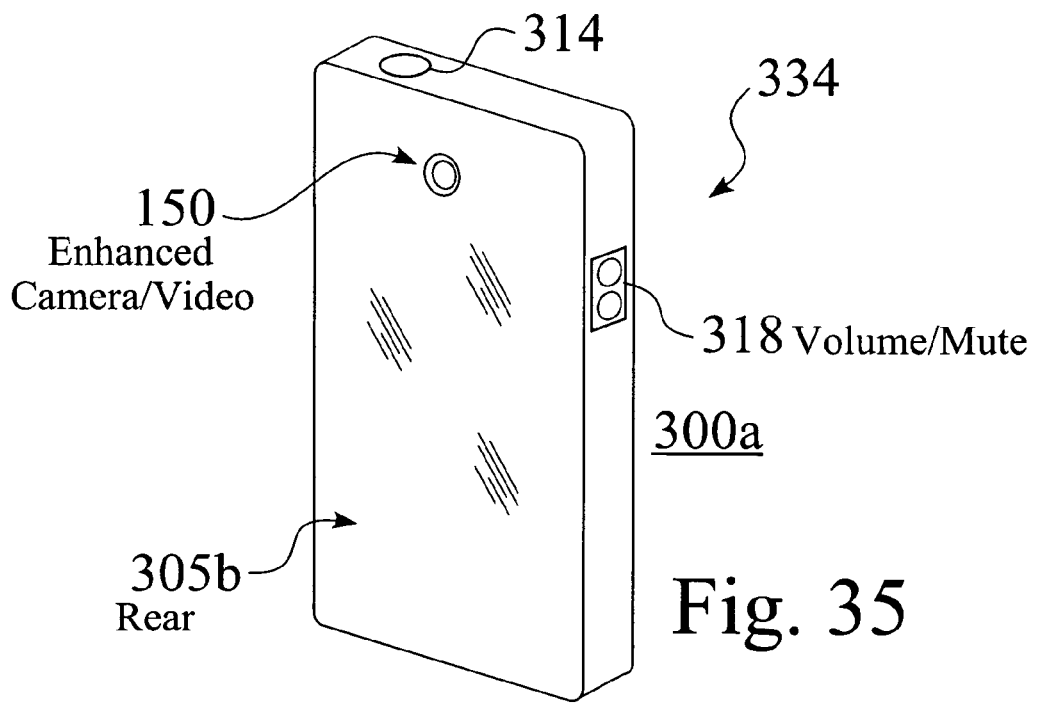
Figure 36:
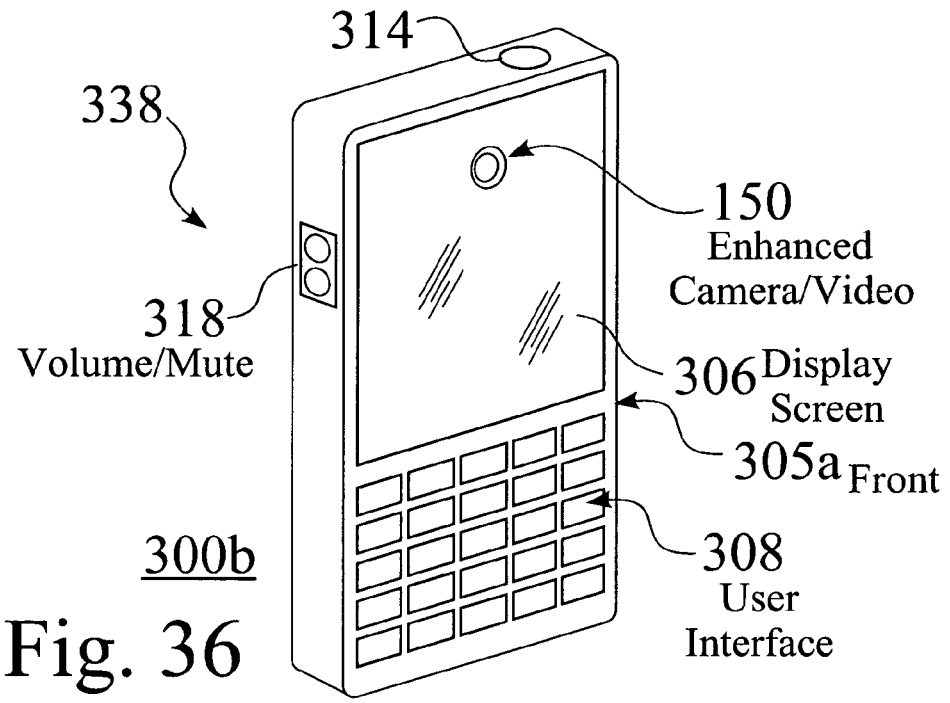
Figure 37:
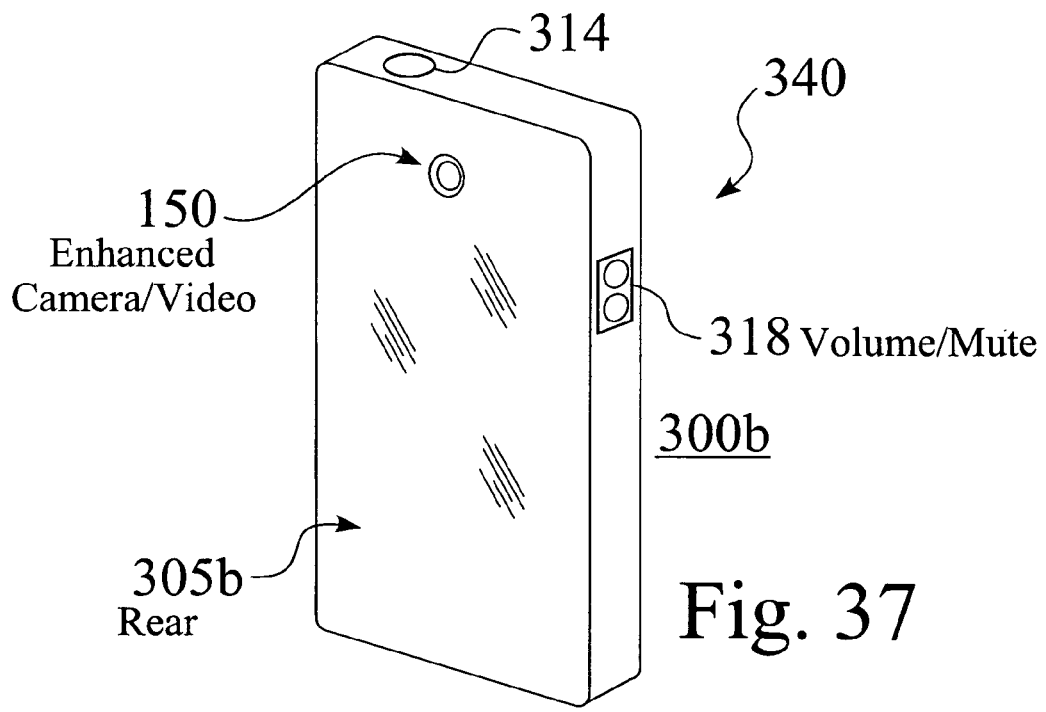

FIGS. 34 and 35 offer perspective views 330 and 334 of an alternative embodiment 300a. FIGS. 36 and 37 offer perspective views 338 and 340 of yet another alternative embodiment 300b.

V. Method to Capture More Detail from a Scene than the Sensor is Otherwise Capable of Recording This alternative method uses multiple rapid exposures with the image moved slightly for each exposure.

In the illustrated example, four exposures are taken of the same scene, with the image shifted by ½ pixel in each of four directions for each exposure. (In practice, three, four, five or more exposures might be used with variations on the amount of image shifting used.)

Figure 38:
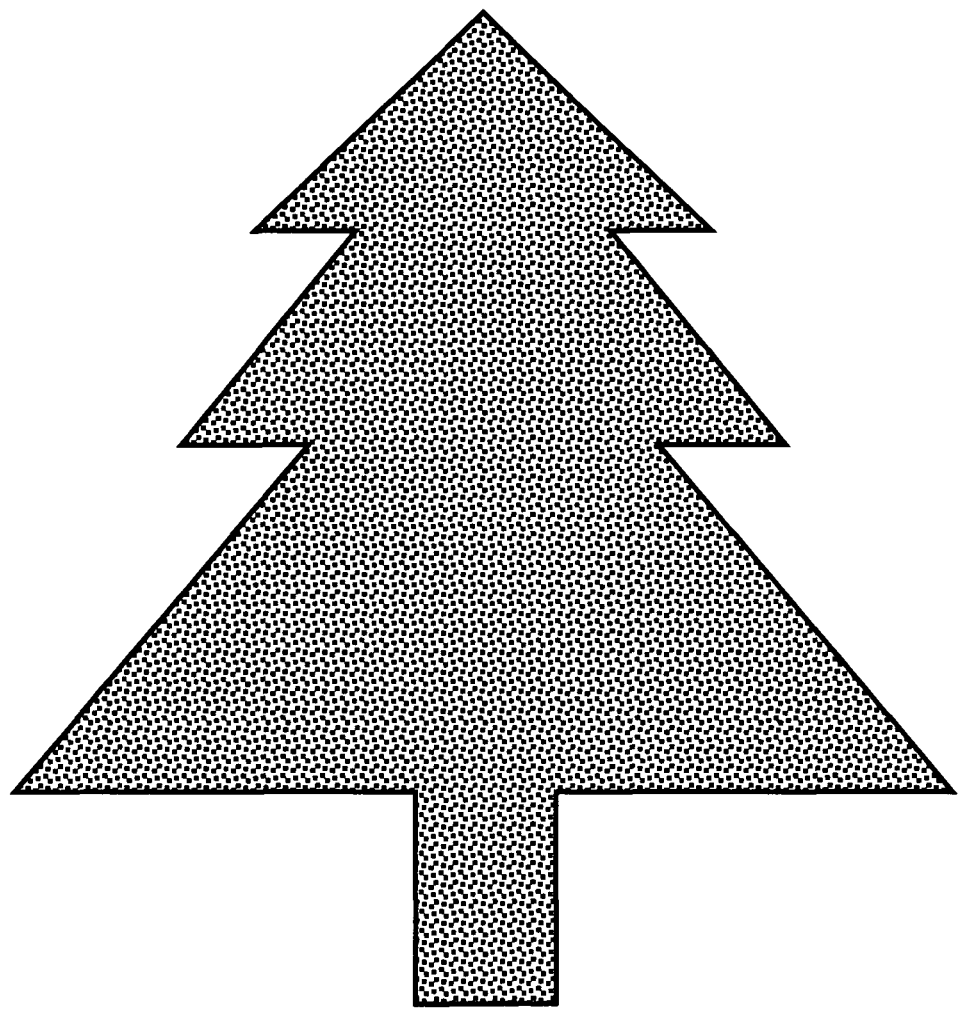

For this example, FIG. 38 shows a tree. In this example, it is far from the camera, and takes up only four pixels horizontally and the spaces between them, plus five pixels vertically with spaces.

(Cameras are currently available at retail with 25 Megapixel resolution, so this tree image represents less than one millionth of the image area and would be undetectable by the human eye without extreme enlargement.)

Figure 39:
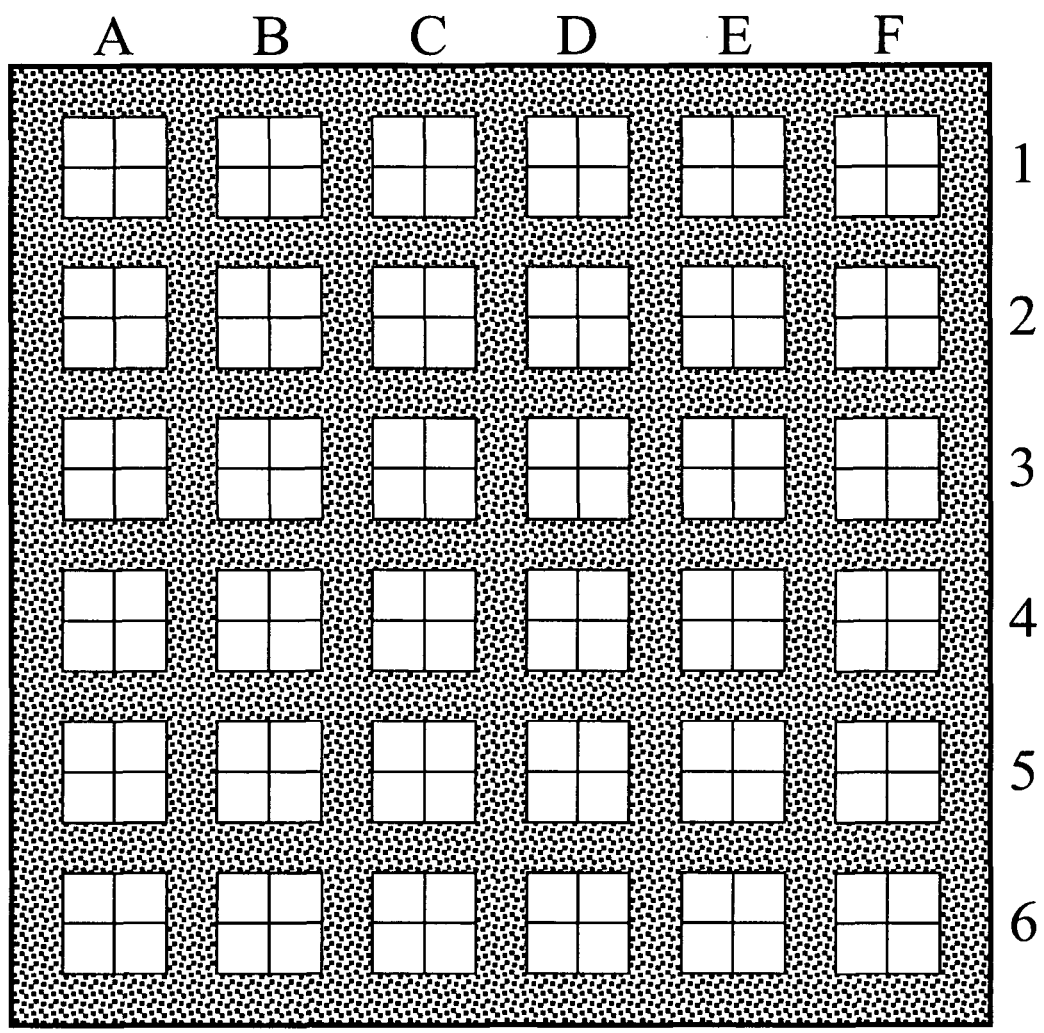

FIG. 39 represents a small section of the camera sensor, which might be either flat or curved. For the following explanation, vertical rows are labeled with letters and horizontal rows are labeled with numbers. The dark areas represent spaces between the pixels.

Figure 40:
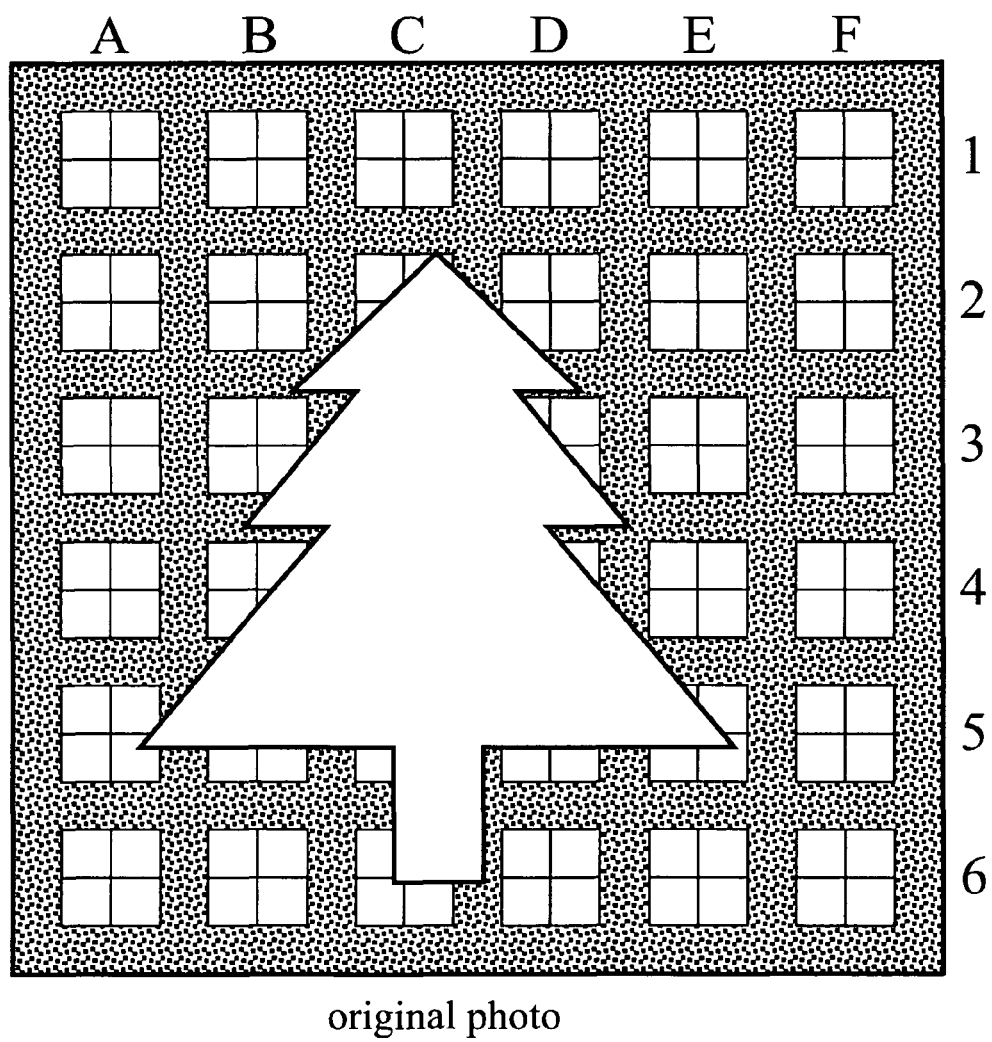

FIG. 40 shows how the tree's image might be first positioned on the pixels. Note that only pixels C2, C3, D3, C4, D4, B5, C5 and D5 are "more covered than not" by the tree image. Those, then, are the pixels that will record its image.

Figure 41:
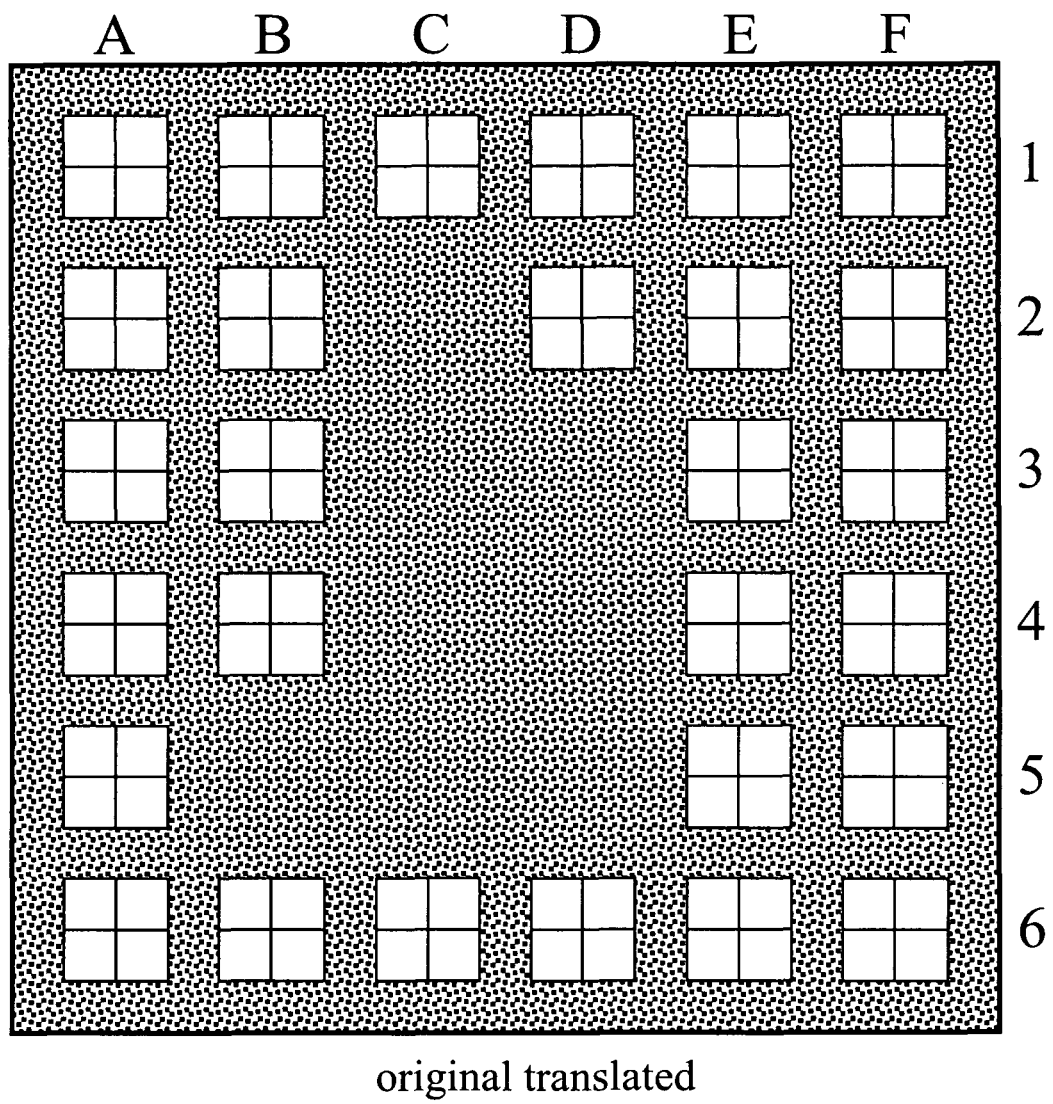

FIG. 41 then shows the resulting image that will represent the tree from this single exposure. The blackened pixels will be that first image.

Figure 42:
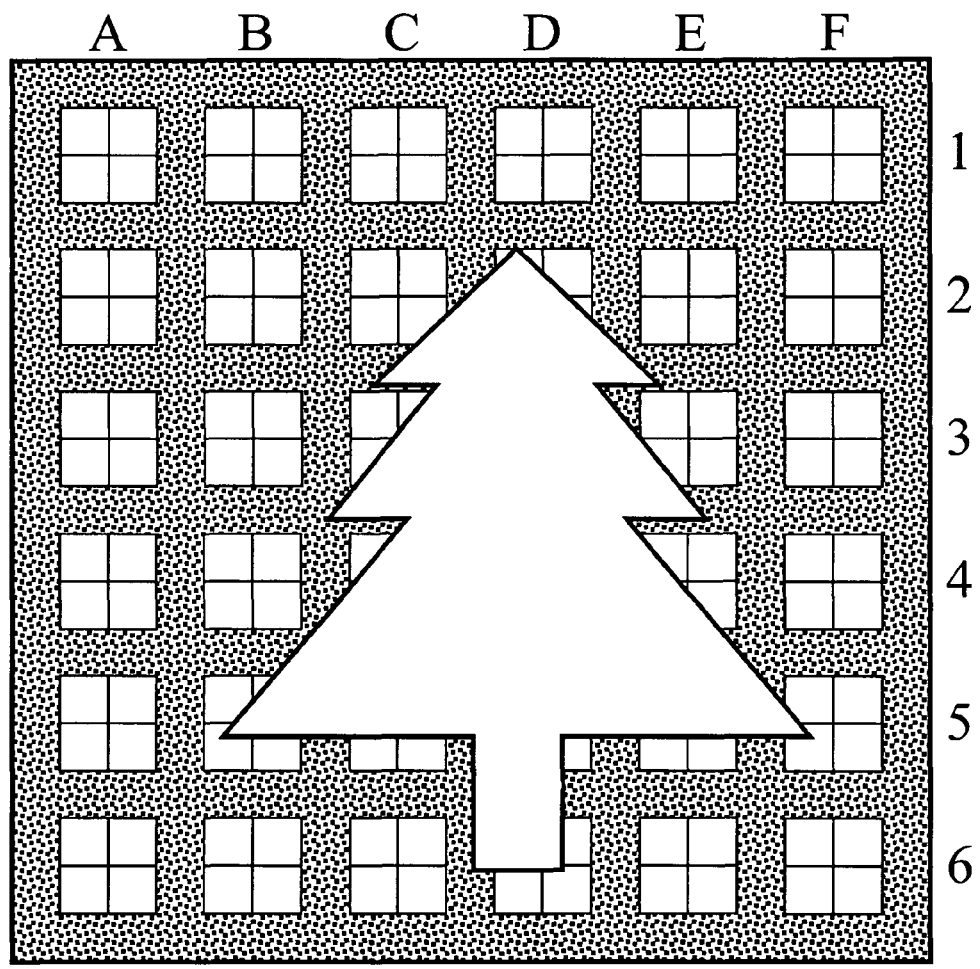

FIG. 42, however, represents a second exposure. Note that the image for this exposure has been shifted by ½ pixel to the right. This shift might be done by moving the sensor physically, or, by reversing the process known in the industry as "image stabilization." Image stabilization is a method to eliminate blur caused by camera movement during exposures. Reversing that process to move the image focused on the sensor, for additional exposures, and between those exposures, is a unique concept and is claimed for this invention.

With FIG. 42, the resulting pixels that are "more covered than not" by the image are D2, C3, D3, C4, D4, (E4 might go either way,) C5, D5 and E5.

Figure 43:
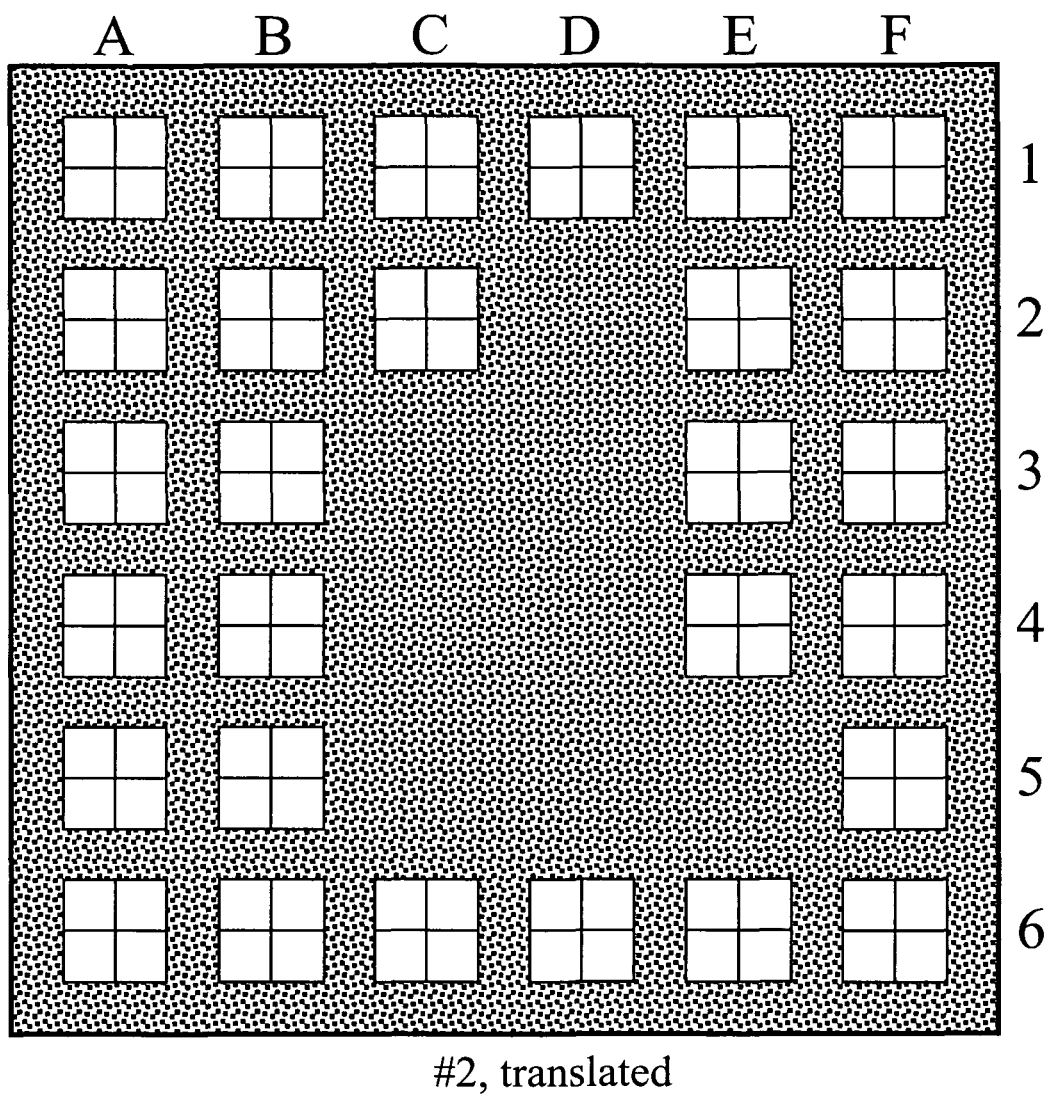

This results in a data collection for this image as shown by FIG. 43.

Figure 44:
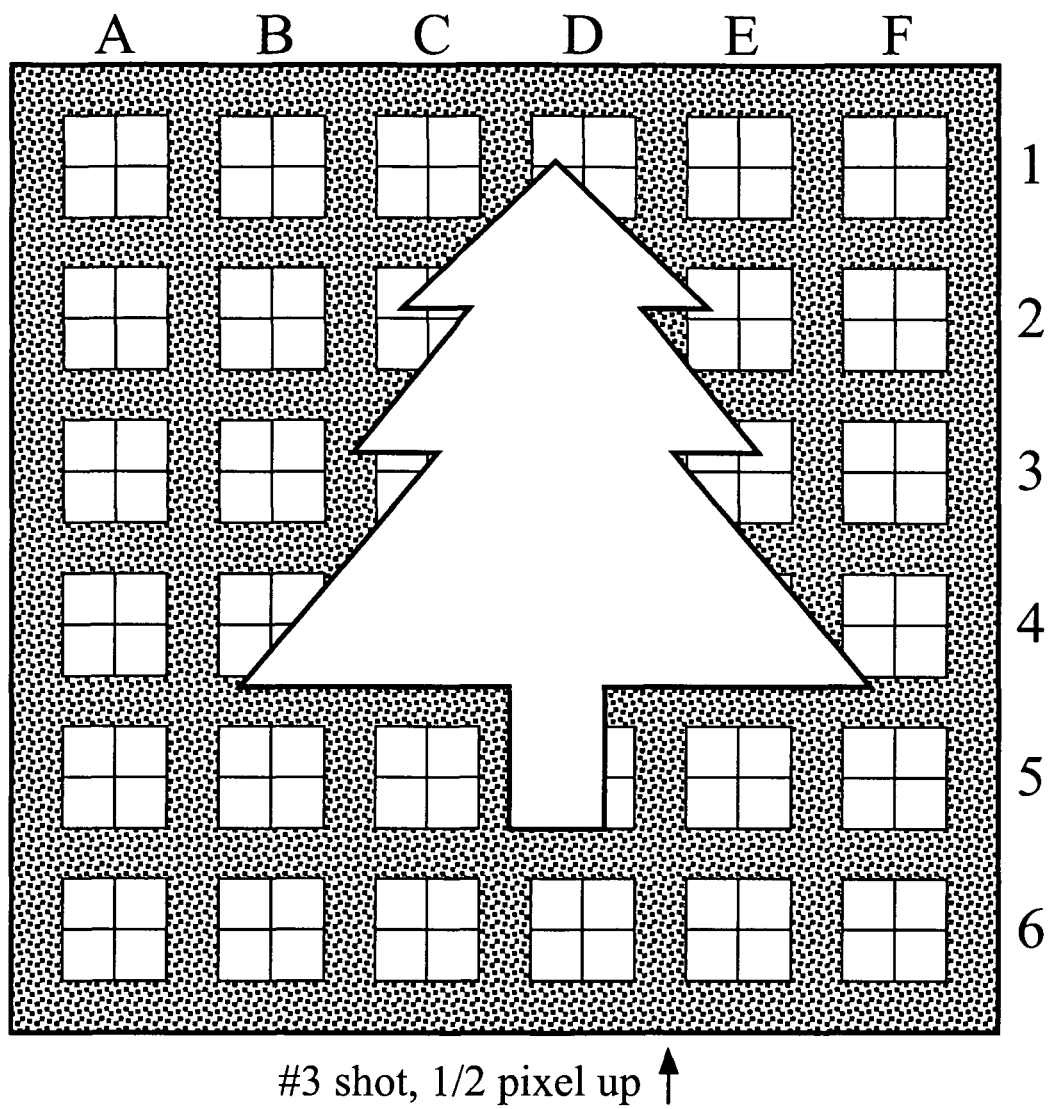

FIG. 44 represents a third exposure. This time the image is moved up from exposure 2 by ½ pixel. The results are that the tree is picked up on pixels D2, C3, D3, C4, D4, E4 and D5.

Figure 45:
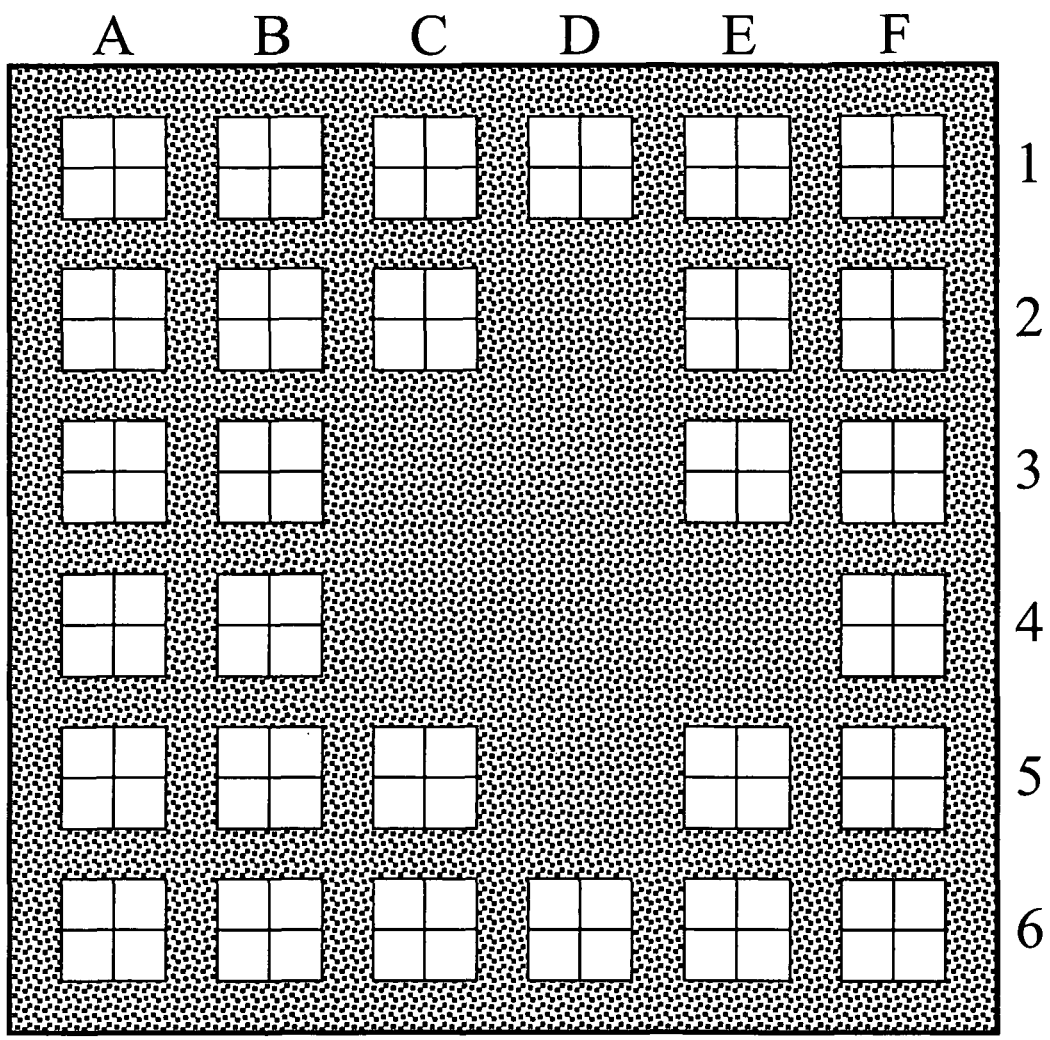

This third exposure, then, is represented by data collected as shown in FIG. 45.

Figure 46:
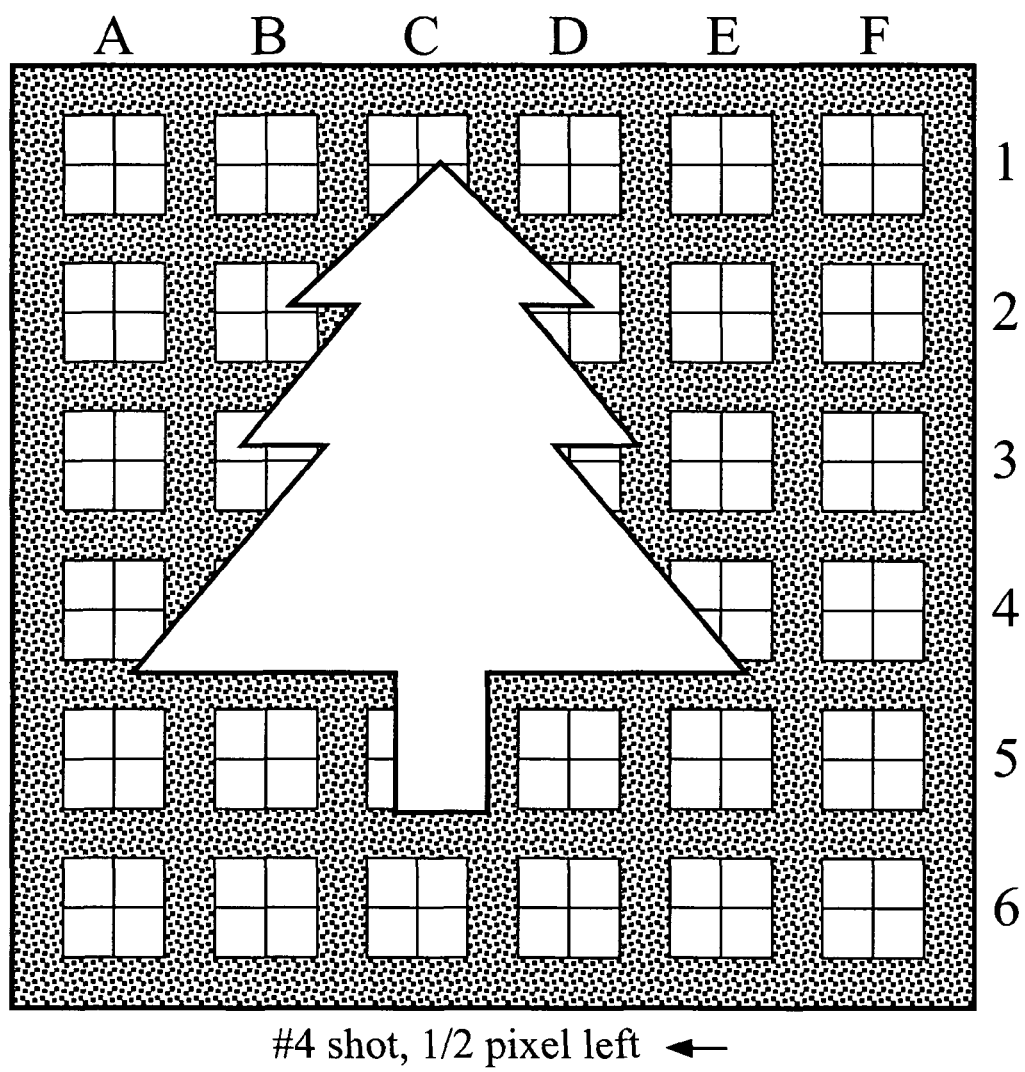

FIG. 46 continues the example. In this case, the image is now shifted to the left by ½ pixel from the third exposure. The result is that imagery is caught by pixels C2, C3, D3, B4, C4, D4 and C5.

Figure 47:
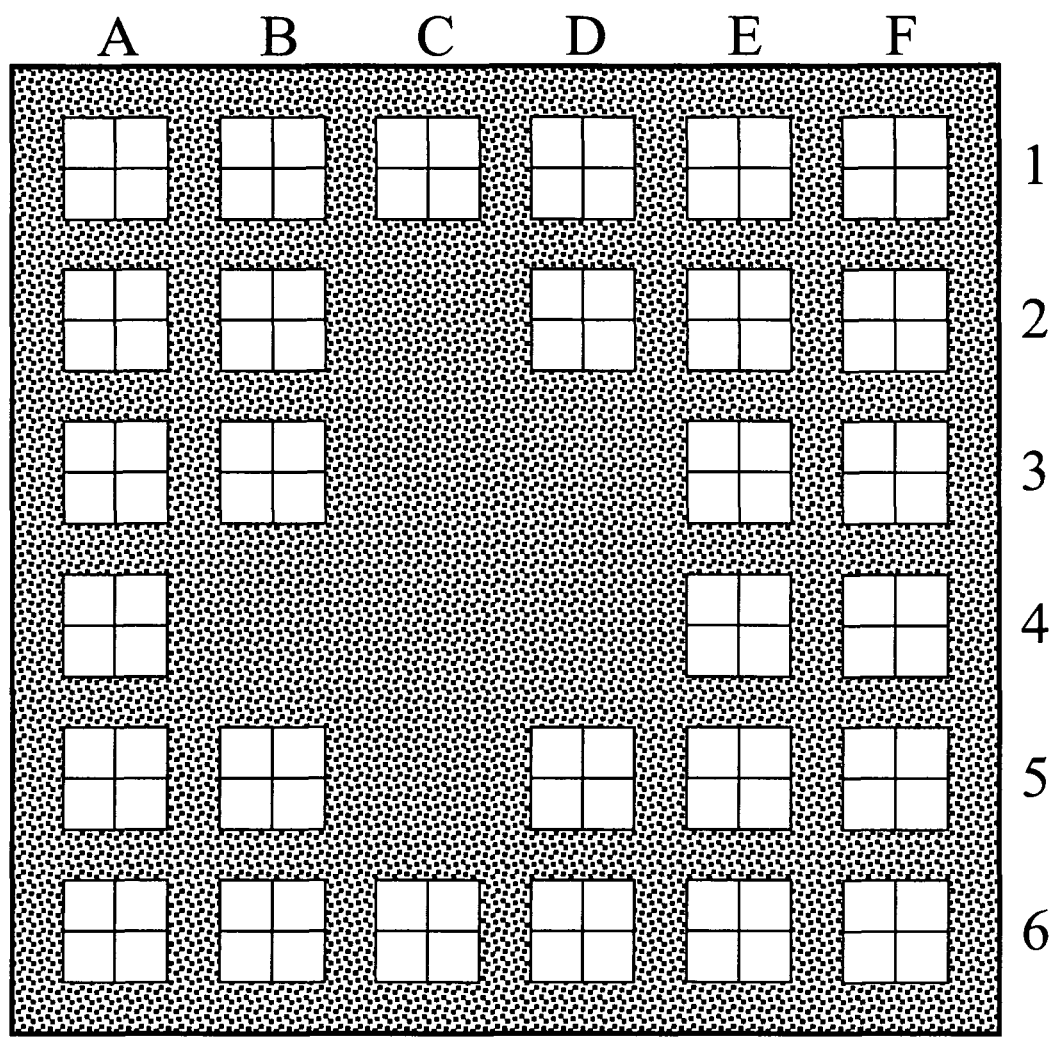

FIG. 47 represents that fourth recorded image.

Now the camera has four views of the same tree image.

Current image stabilization neutralizes tiny hand tremors and even some motor or other vibrations during a single exposure, eliminating blur. That capability suggests moving the image to second, third and fourth or more positions can occur quickly.

Pixel response times are also improving regularly, to the point that digital cameras that were formerly only still cameras, have, for the most part, also become motion picture cameras in subsequent model enhancements. This also suggests that rapid multiple exposures can be done; particularly since this is the essence of motion photography.

What has not been done or suggested is changing the mode of the image stabilization mechanism so that it moves the image slightly, and by a controlled amount, for each of the multiple exposures, while stabilizing the image during each exposure.

Alternatively, moving the sensor slightly for the same effect is also a novel method.

Software interprets the four captured images and are part of this invention's claims. The software "looks" at FIGS. 45 and 47, and conclude that whatever this image is, it has a stub centered at the bottom. Because this stub is missing from FIGS. 41 and 43, the software concludes that it is one pixel wide and is a half pixel long.

The software looks at all four figures and determine that whatever this is, it has a base that's above that stub, and that base is wider than the rest of the image, going three pixels horizontally. This comes from line five in FIGS. 41 and 43 plus line four in FIGS. 45 and 47.

The software looks at lines three and four in FIG. 41 and FIG. 43 and conclude that there is a second tier above the broad base in this image, whatever it is, that is two pixels wide and two pixels tall.

But, the software also looks at lines three in FIG. 45 and FIG. 47, confirming that this second tier is two pixels wide, but, that it may only be one pixel tall.

The software averages these different conclusions and make the second tier 1 ½ pixels tall.

The software looks at line two in all four images and realize that there is a narrower yet image atop the second tier. This image is consistently one pixel wide and one pixel high, sits atop the second tier but is always centered over the widest bottom tier, and the stub when the stub appears.

Figure 48:
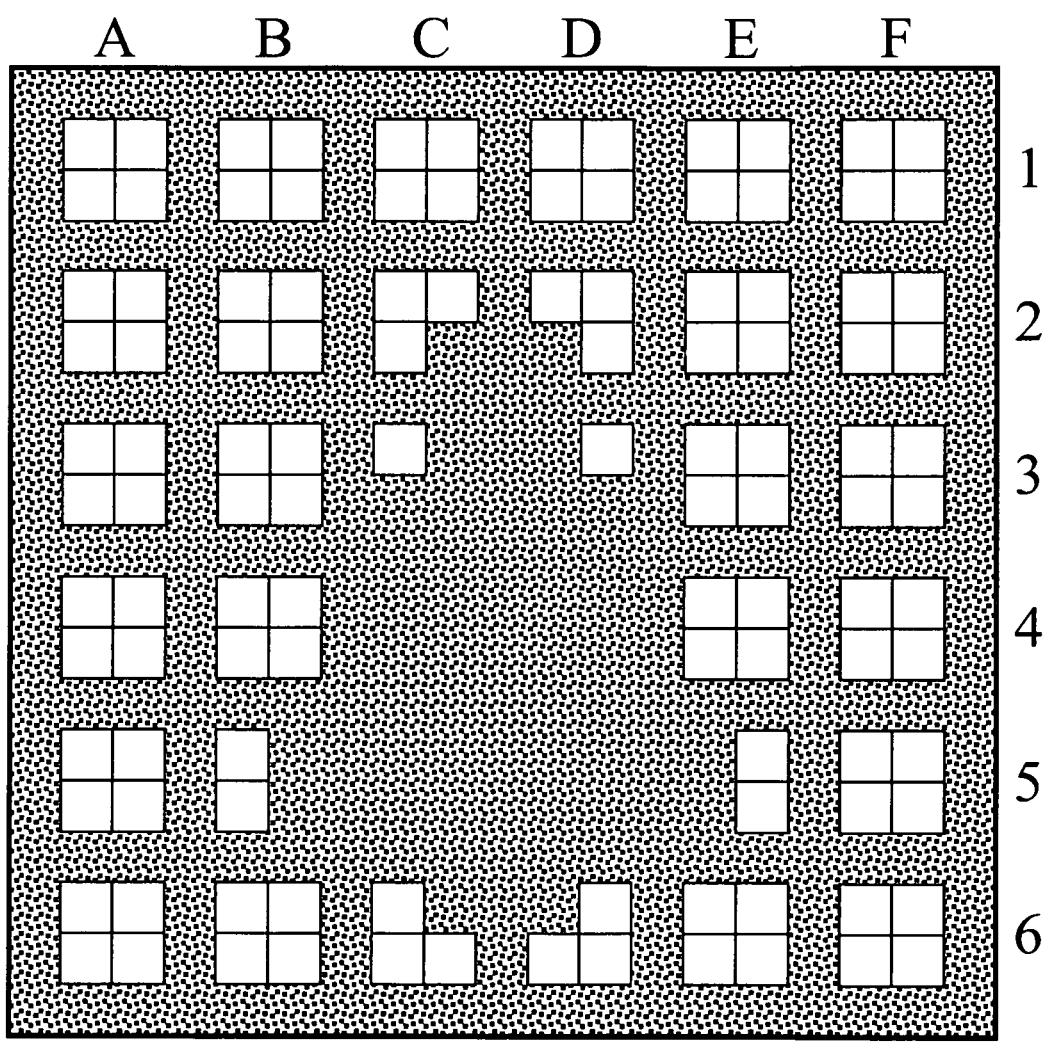

FIG. 48 shows the resulting data image recorded by taking four images, each ½ pixel apart from the adjoining exposures taken. Note that since the data has four times as much information, the composite image, whether on screen or printed out, will produce ¼ fractions of pixels. This shows detail that the sensor screen was incapable of capturing with a single exposure.

Figure 49:
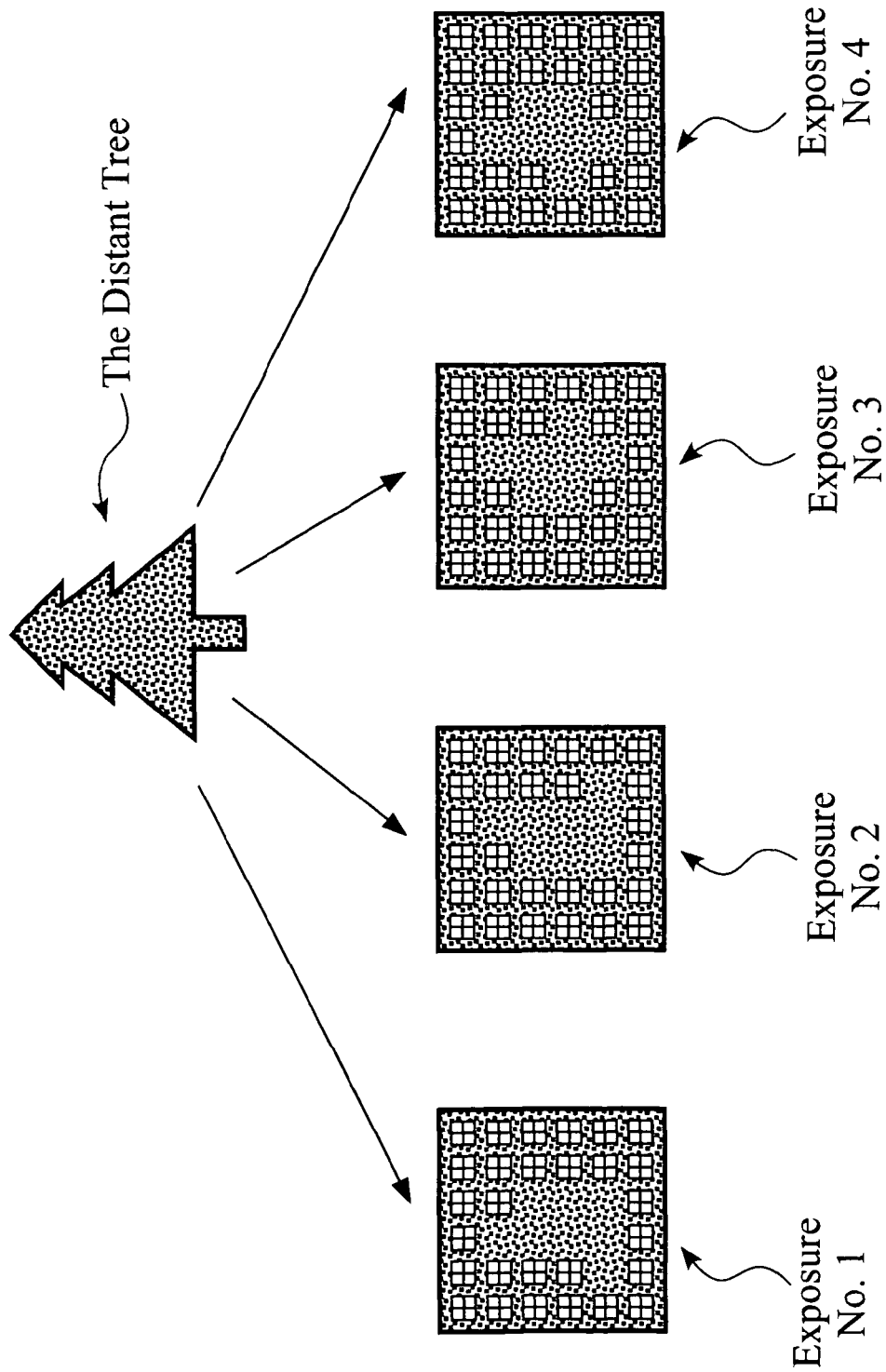

FIG. 49 shows the original tree image, as it would be digitally recorded in four varying exposures on the sensor, each positioned ½ pixel apart. FIG. 49 shows the tree itself, and the four typical digital images that would be recorded by four individual exposures of that tree. None look anything like a tree.

Figure 50:
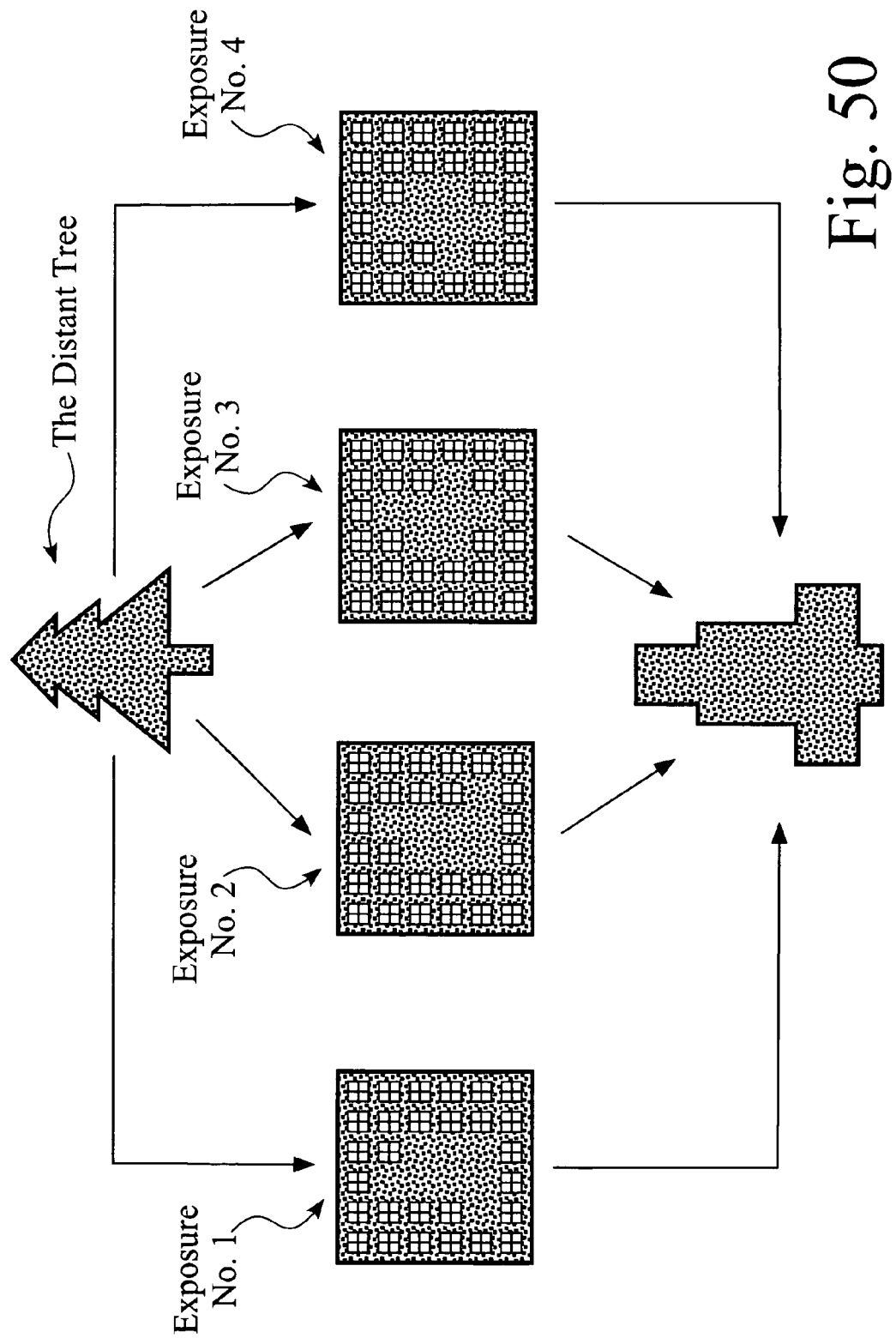

The tree is captured digitally four times. None of these look like a tree. FIG. 50 shows how the original tree breaks down into the multiple images, and, how the composite, created by the software from those four images, starts to resemble a tree.

VI. Alternative Method for Forming a Curved Sensor

One embodiment of this new method proposes to create a concave mold to shape the silicon after heating the wafer to a nearly molten state. Gravity then settles the silicon into the mold. In all of these methods, the mold or molds could be chilled to maintain the original thickness uniformly by reducing the temperature quickly. Centrifuging is a second possible method. The third is air pressure relieved by porosity in the mold. A fourth is steam, raised in temperature by pressure and/or a liquid used with a very high boiling point. The fourth is simply pressing a convex mold onto the wafer, forcing it into the concave mold, but again, doing so after raising the silicon's temperature.

Heating can occur in several ways. Conventional "baking" is one. Selecting a radiation frequency that affects the silicon significantly more than any of the other materials is a second method. To enhance that second method, a lampblack like material that absorbs most of the radiation might be placed on the side of the silicon that's to become convex. It absorbs the radiation, possibly burns off in the process but heats the thickness of the wafer unevenly, warming the convex side the most, which is where the most stretching occurs. A third method might be to put this radiation absorbing material on both surfaces, so the concave side, which absorbs compression tension and the convex side, which is pulled by tensile stresses, are each heated to manage these changes without fracturing.

A final method is simply machining, polishing or laser etching away the excess material to create the curved sensor.

In the first embodiment, the curved surface is machined out of the silicon or other ingot material. The ingot would be thicker than ordinary wafers. Machining could be mechanical, by laser, ions or other methods.

In the second embodiment, the wafer material is placed over a pattern of concave discs. Flash heating lets the material drop into the concave shape. This may be simply gravity induced, or, in another embodiment, may be centrifuged. Another enhancement may be to "paint" the backside with a specific material that absorbs a certain frequency of radiation to heat the backside of the silicon or other material while transmitting less heat to the front of the sensor. This gives the silicon or other material most flexibility across the side being stretched to fit the mold while the front, which compresses mildly, is less heated.

Radiation frequency and the absorbent "paint" would be selected to minimize or eliminate any effect on the dopants.

SCOPE OF THE CLAIMS

Although the present invention has been described in detail with reference to one or more preferred embodiments, persons possessing ordinary skill in the art to which this invention pertains will appreciate that various modifications and enhancements may be made without departing from the spirit and scope of the Claims that follow. The various alternatives for providing a Mobile Communicator with Curved Sensor Camera that have been disclosed above are intended to educate the reader about preferred embodiments of the invention, and are not intended to constrain the limits of the invention or the scope of Claims.

LIST OF REFERENCE CHARACTERS

10 Camera with curved sensor
12 Curved sensor
14 Enclosure
16 Objective lens
18 Incoming light
20 Electrical output from sensor
22 Signal processor
24 User controls
26 Battery
28 Memory
30 Camera output
32 Facet
34 Gap between facets
36 Via
38 Wiring backplane
40 Curved sensor formed from adjoining petal-shaped segments.
42 Petal-shaped segment
43a First Mandrel
43b Substrate
43c First sheet of deformable material
43d Dome portion of deformable material over mandrel
43e Hemispherical base for curved sensor
43f Second sheet of deformable material
43g Second mandrel
43h Ports
43i Empty region
43j Heater
43k Hemispherical base for curved sensor
43l sensor after sensor pixels 43l have been formed on the base 43e or 43k.
44 Camera monitor
46 Conventional sensor with generally uniform pixel density
48 Sensor with higher pixel density toward center
50 Pixel
52 Shade retracted
54 Shade extended
56 Multi-lens camera assembly
58 Objective lens
60 Mirrored camera/lens combination
62 Primary objective lens
64 Secondary objective lens
66 First sensor
68 Second sensor
70 Mirror
72 Side-mounted sensor
74 Sensor in original position
76 Sensor in rotated position
78 Sensor in original position
80 Sensor in displaced position
82 Alternative embodiment of sensor
84 Alternative embodiment of sensor
86 Alternative embodiment of sensor
88 Alternative embodiment of sensor
90 View of rear of one embodiment of sensor
92 Spiral-shaped conductor
94 Connection to sensor
96 Connection to processor
98 View of rear of one embodiment of sensor
100 Accordion-shaped conductor
102 Connection to sensor
104 Connection to processor
106 View of rear of one embodiment of sensor
108 Radial conductor
110 Brush
112 Brush contact point
114 Annular ring
116 Center of sensor, connection point to processor
118 Schematic view of wireless connection
120 Transmitter
122 Receiver
124 Processor
150 Camera
154 Enclosure
156 Lens
160 Sensor
162 Facets
164 Gaps
170 Center square
172 Ring of squares
176 Ring of squares
180 Shade extender arrangement
182 Inner shade member
184 Movable shade member
186 Outer, movable shade members
190 Lens moving mechanism
200 Image sequence processor
202 Sensor capture device
204 Auto device
206 Pixel density normalization device
208 Image processing engine
210 Display/LCD controller
212 Compression and storage controller
250 Camera
256 Lens
260 Sensor
270 Central region facet
272 Surrounding region facets
274 Shutter control
280 Lens shade actuator
290 Focus/stabilization actuator
292 Lens moving
300 First embodiment of combined device
300a First embodiment of combined device
300b First embodiment of combined device
302 Housing
304 Micro-controller
305a Front side
305b Back side 306 Display screen
308a Touch screen interface
308b User interface
310 Terminal for power and/or data
314 Speaker
315 Antenna
330 View of alternative embodiment
334 View of alternative embodiment
338 View of alternative embodiment
340 View of alternative embodiment

What is claimed is:

1. A method comprising the steps of:
providing a mobile communication device; said mobile communication device including a camera; said camera including an optical train and a curved sensor; said curved sensor including a plurality of facets generally bounded by a plurality of gaps; said camera including an optical train motion means for intentionally imparting movement to said optical train;
recording a first exposure;
activating said optical train motion means to intentionally impart movement to said optical train while said second exposure is taken;
recording a second exposure;
comparing said first and said second exposures to detect any missing portions of the desired image due to said plurality of gaps in said curved sensor; and
composing a complete image using both said first and said second exposures.

2. A method comprising the steps of:
providing a mobile communication means for providing communication capabilities;
said mobile communication means including an enclosure;
said enclosure including
an objective lens;
said objective lens being mounted on said enclosure;
said objective lens for collecting a stream of radiation; and
fabricating a curved sensor;
said curved sensor including a plurality of planar facets;
said curved sensor being mounted inside said enclosure;
said curved sensor being aligned with said objective lens;
said curved sensor having a portion which extends beyond a generally two-dimensional plane;
generating an image using the output of said curved sensor;
capturing only a small portion of a central image produced by said curved sensor;
using a monitor to display said small portion of an overall image;
digitally zooming out to a telephoto view; and
producing an enhanced quality image by taking advantage of a relatively high density of pixels in the center of said curved sensor.

3. A method comprising the steps of:
providing a mobile communication means for providing communication capabilities;
said mobile communication means including an enclosure;
said enclosure including
an objective lens;
said objective lens being mounted on said enclosure;
said objective lens for collecting a stream of radiation; and
fabricating a curved sensor;
said curved sensor including a plurality of planar facets;
said curved sensor being mounted inside said enclosure;
said curved sensor being aligned with said objective lens;
said curved sensor having a portion which extends beyond a generally two-dimensional plane;
generating an image using the output of said curved sensor;
capturing only a small portion of a central image produced by said curved sensor;
using a monitor to display said small portion of an overall image;
digitally zooming out back to a wide angle view; and
producing an enhanced quality image by compressing data in the center of said overall image to approximate the density of the pixels in the edges of said overall image.

4. A method comprising the steps of:
providing a mobile communication means for providing communication capabilities;
said mobile communication means including an enclosure;
said enclosure including
an objective lens;
said objective lens being mounted on said enclosure;
said objective lens for collecting a stream of radiation; and
fabricating a curved sensor;
said curved sensor including a plurality of planar facets;
said curved sensor being mounted inside said enclosure;
said curved sensor being aligned with said objective lens;
said curved sensor having a portion which extends beyond a generally two-dimensional plane;
generating an image using the output of said curved sensor;
taking a first image and a second image in rapid succession;
said first image being taken at a time when said curved sensor is in a first orientation;
said second image being taken at a time when said curved sensor has been altered so that it is in a second orientation;
recognizing the portion of the image missing from said first image; and
stitching the data in from the second image.

5. A method as recited in claim 4, in which:
said curved sensor is rotated to achieve its second orientation.

6. A method as recited in claim 4, in which:
said curved sensor is displaced to achieve its second orientation.

7. A method comprising the steps of:
providing a mobile communication means for providing communication capabilities;
said mobile communication means including an enclosure;
said enclosure including
an objective lens;
said objective lens being mounted on said enclosure;
said objective lens for collecting a stream of radiation; and
fabricating a curved sensor;
said curved sensor including a plurality of planar facets;
said curved sensor being mounted inside said enclosure;
said curved sensor being aligned with said objective lens;
said curved sensor having a portion which extends beyond a generally two-dimensional plane;
generating an image using the output of said curved sensor; and
tilting said objective lens during two rapid sequence exposures to provide image stabilization.

8. A method comprising the steps of:
providing a mobile communication means for providing communication capabilities;
said mobile communication means including an enclosure;
said enclosure including
an objective lens;
said objective lens being mounted on said enclosure;
said objective lens for collecting a stream of radiation; and
fabricating a curved sensor;
said curved sensor including a plurality of planar facets;
said curved sensor being mounted inside said enclosure;

said curved sensor being aligned with said objective lens;
said curved sensor having a portion which extends beyond a generally two-dimensional plane;
generating an image using the output of said curved sensor;
taking a first exposure of a scene;
taking a second exposure of said scene with its image moved slightly relative to said first exposure; and
interpreting said first and said second exposures to identify an object in said scene.

* * * * *